(12) United States Patent
Hopkins et al.

(10) Patent No.: US 12,266,569 B2
(45) Date of Patent: Apr. 1, 2025

(54) INTEGRATED CIRCUITRY, A MEMORY ARRAY COMPRISING STRINGS OF MEMORY CELLS, A METHOD USED IN FORMING A CONDUCTIVE VIA, A METHOD USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Shuangqiang Luo, Boise, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/416,243

(22) Filed: Jan. 18, 2024

(65) Prior Publication Data
US 2024/0203791 A1 Jun. 20, 2024

Related U.S. Application Data

(62) Division of application No. 17/227,734, filed on Apr. 12, 2021, now Pat. No. 11,915,974.

(51) Int. Cl.
| | |
|---|---|
| *H01L 23/535* | (2006.01) |
| *H01L 21/768* | (2006.01) |
| *H10B 41/27* | (2023.01) |
| *H10B 43/27* | (2023.01) |

(52) U.S. Cl.
CPC .. *H01L 21/76895* (2013.01); *H01L 21/76805* (2013.01); *H01L 21/76829* (2013.01); *H01L 23/535* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | |
|---|---|---|
| 2014/0349455 A1 | 11/2014 | Ahn |
| 2020/0295031 A1 | 9/2020 | Lue |
| 2021/0125928 A1 | 4/2021 | Kim et al. |
| 2021/0151462 A1 | 5/2021 | Baek |
| 2021/0167080 A1 | 6/2021 | Han et al. |

(Continued)

*Primary Examiner* — Asok K Sarkar
(74) *Attorney, Agent, or Firm* — Wells St. John P.S.

(57) ABSTRACT

Integrated circuitry comprises vertical conductive vias individually having a lower portion thereof that is directly against conductor material of islands. The islands comprise multiple different composition materials directly above the conductor material. Apart from the conductive vias, the islands individually comprise at least one of (a), (b), or (c), where: (a): a top material that is of different composition from all material that is vertically between the top material and the conductor material; (b): the top material having its top surface in a vertical cross-section extending laterally-outward beyond two opposing laterally-outermost edges of a top surface of the material that is immediately directly below the top material; and (c): is of different composition from that of an upper portion of the conductor material and including a portion thereof that is elevationally coincident with the conductor material or that is directly against the conductor material. Other embodiments, including methods, are disclosed.

12 Claims, 22 Drawing Sheets

(56) References Cited

U.S. PATENT DOCUMENTS

| | | |
|---|---|---|
| 2021/0175248 A1 | 6/2021 | Haller et al. |
| 2021/0257301 A1 | 8/2021 | Matsumoto |
| 2022/0246628 A1 | 8/2022 | Scarbrough et al. |
| 2023/0081495 A1 | 3/2023 | Cho et al. |

INTEGRATED CIRCUITRY, A MEMORY ARRAY COMPRISING STRINGS OF MEMORY CELLS, A METHOD USED IN FORMING A CONDUCTIVE VIA, A METHOD USED IN FORMING A MEMORY ARRAY COMPRISING STRINGS OF MEMORY CELLS

RELATED PATENT DATA

This patent resulted from a divisional application of U.S. patent application Ser. No. 17/227,734, filed Apr. 12, 2021, entitled "Integrated Circuitry, A Memory Array Comprising Strings Of Memory Cells, A Method Used In Forming A Conductive Via, A Method Used In Forming A Memory Array Comprising Strings Of Memory Cells", naming John D. Hopkins, Shuangqiang Luo, and Alyssa N. Scarbrough as inventors, the disclosure of which is incorporated by reference.

TECHNICAL FIELD

Embodiments disclosed herein pertain to integrated circuitry, to memory arrays comprising strings of memory cells, to methods used in forming a conductive via, and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-40 which may be considered as a "gate-last" or "replacement-gate" process.

Figure 1:
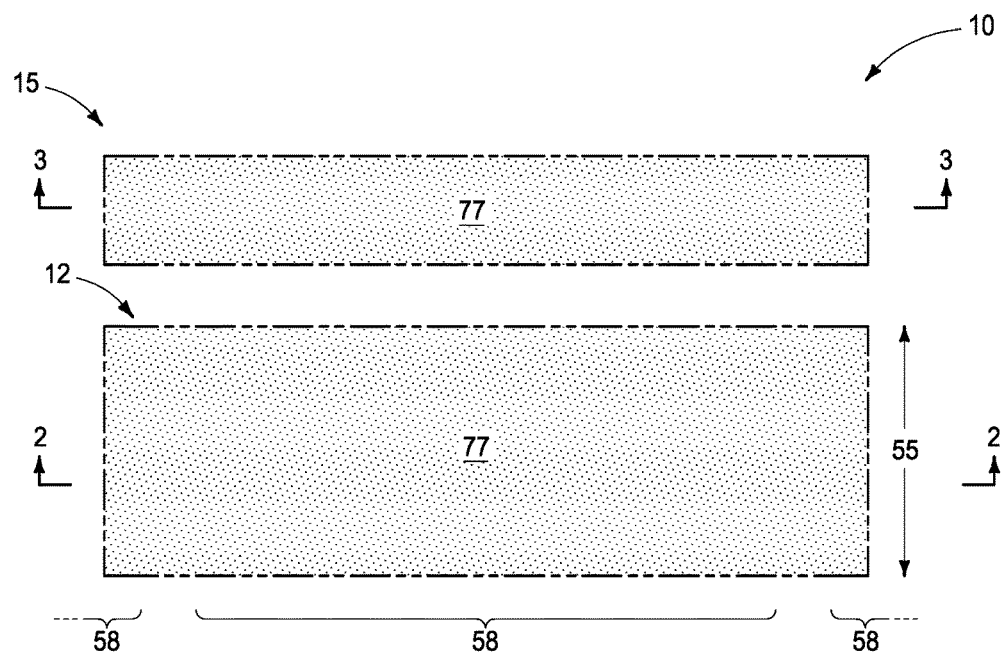
FIGS. 1-3 are diagrammatic cross-sectional views of portions of what will be an array of elevationally-extending strings of memory cells in accordance with an embodiment of the invention.
Figure 2:
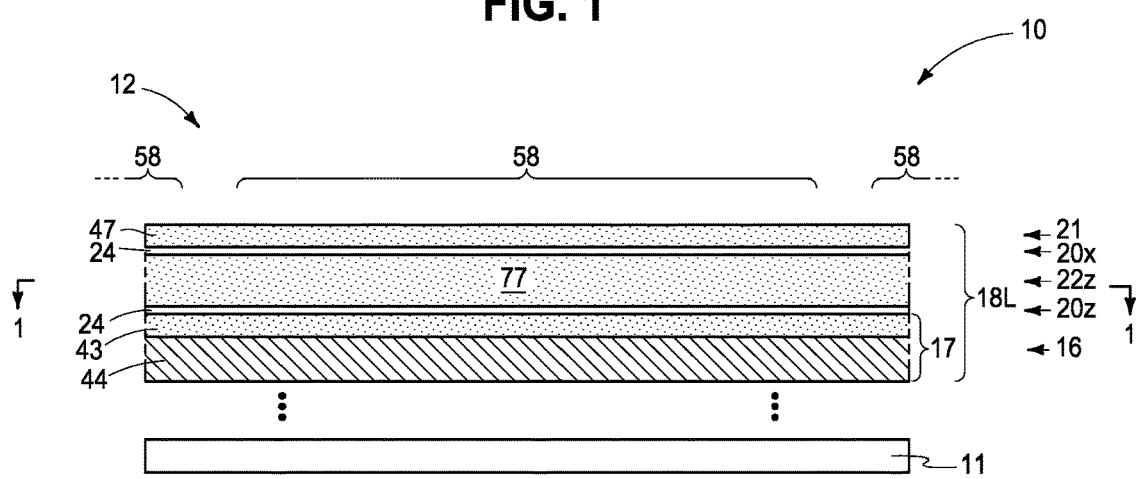
Figure 3:
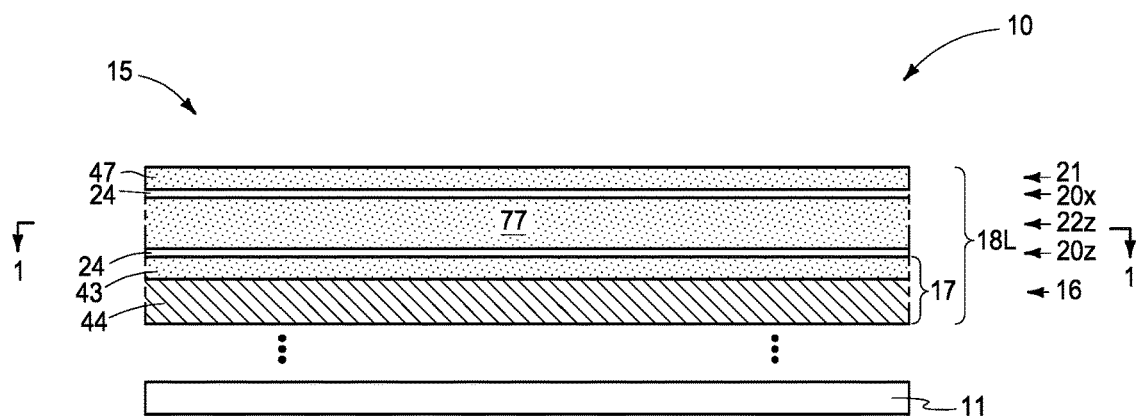

FIGS. 1-3 show a construction 10 having an array region 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within an array (e.g., array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

FIGS. 1 and 3 show part of a through-array-via (TAV) region 15 that may be part of array region 12 or laterally-outward thereof (in a vertical cross-section). In this document, a "TAV region" is a region in which operative TAVs are present or will be formed. An "operative TAV" is a circuit-operative conductive interconnect extending through stack 18 and between electronic components at different elevations in a finished construction of integrated circuitry that has been or is being fabricated (not yet shown). A TAV region may also contain one or more dummy structures that may be one or more dummy TAVs (i.e., a circuit-inoperative structure extending through stack 18 of the same construction as an operative TAV and that may be in a finished construction of integrated circuitry that has been or is being fabricated, and not shown). TAV region 15 may be undefined or indistinguishable in construction 10 at this point in processing. By way of examples only, the TAV region may be in a memory plane or outside of a memory plane (e.g., being edge-of-plane or in a stair-step region).

Construction 10 comprises a lower portion 18L comprising through-array-via (TAV) region 15 and array region 12. Lower portion 18L comprises or is part of a stack 18* that is being fabricated in accordance with method embodiments (an * being used as a suffix to be inclusive of all such same-numerically-designated components that may or may not have other suffixes). Lower portion 18L comprises a conductor tier 16 comprising conductor material 17. As an example, conductor material 17 comprises upper conductor material 43 (e.g., n-type or p-type conductively-doped polysilicon) directly above (e.g., directly against) lower conductor material 44 (e.g., $WSi_x$) of different composition from upper conductor material 43. Conductor tier 16 may comprise part of control circuitry (e.g., peripheral-under-array circuitry and/or a common source line or plate) used to control read and write access to the transistors and/or memory cells that will be formed within array region 12.

Lower portion 18L comprises multiple different composition materials (i.e., at least two; e.g., three examples 24, 77, 47 being shown) that have been formed directly above conductor tier 16. Lower portion 18L may be considered as comprising laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated horizontally, for example along a direction 55. Memory-block regions 58 may not be discernable at the time of processing shown by FIGS. 1-3. Example lower portion 18L comprises vertically-alternating first tiers 22* and second tiers 20*. In one embodiment and as shown, a lowest second tier 20z of lower portion 18L is directly above (e.g., directly against) conductor material 17. Tier 20z may be sacrificial. A lowest first tier 22z of lower portion 18L is directly above (e.g., directly against) tier 20z and comprises material 77 that in one embodiment is sacrificial. Example materials 77 include silicon nitride and doped or undoped polysilicon. In one embodiment, a next-lowest second tier 20x is directly above tier 20z and a conducting-material tier 21 comprising conducting material 47 (e.g., conductively-doped polysilicon) is directly above tier 20x.

Figure 4:
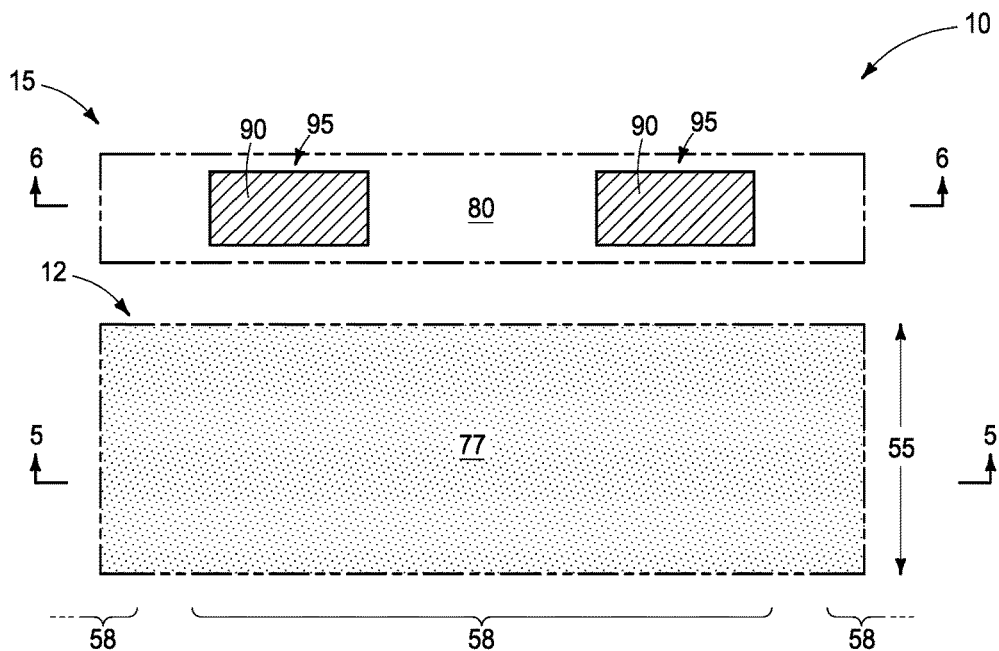
FIGS. 4-40 are diagrammatic sequential sectional and/or enlarged views of the construction of FIGS. 1-3, or portions thereof or alternate and/or additional embodiments, in process in accordance with some embodiments of the invention.
Figure 5:
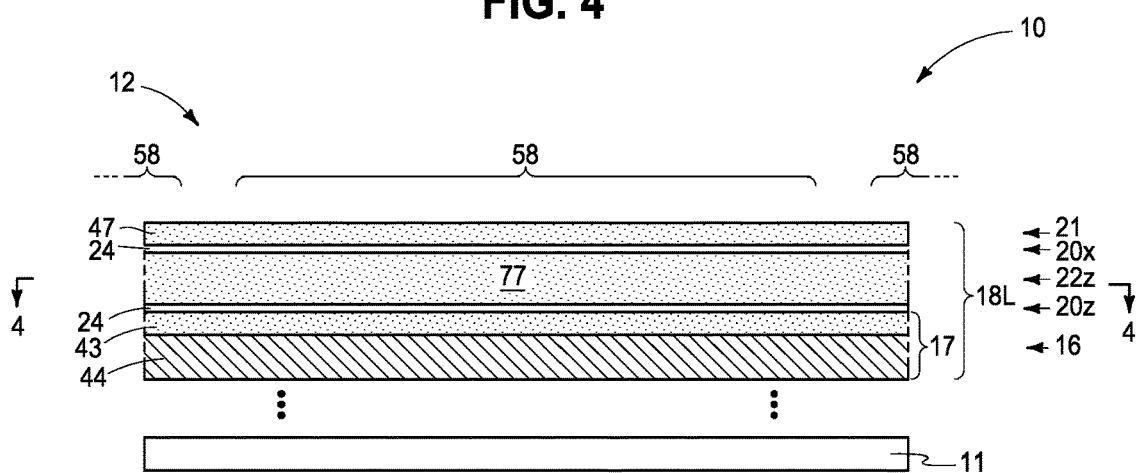
Figure 6:
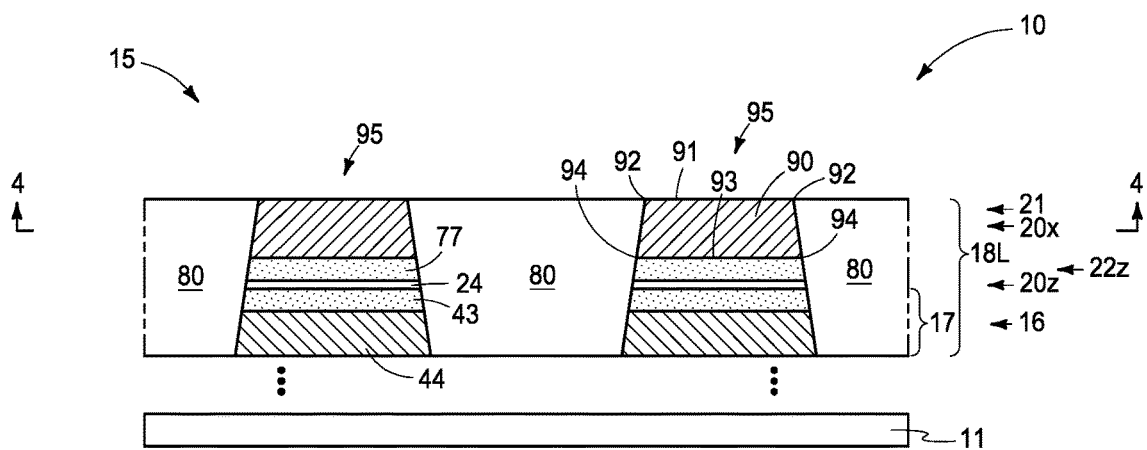

Referring to FIGS. 4-6, islands 95 have been formed in TAV region 15. Individual islands 95 comprise conductor material 17 of conductor tier 16 and multiple different composition materials there-above (e.g., 24, 77, 90). Individual islands 95 comprise an etch-stop material (e.g., 90) that may or may not be one of the different composition materials described above with respect to FIGS. 1-3. The etch-stop material comprises at least one of (a), (b), or (c), where:

(a): the individual islands have a top material that is the etch-stop material and that is of different composition from all material that is vertically between the etch-stop material and the conductor material;

(b): the top material of the individual islands is the etch-stop material and has its top surface in a vertical cross-section extending laterally-outward beyond two opposing laterally-outermost edges of a top surface of the material that is immediately directly below the top material; and (c): a different composition from that of an upper portion of the conductor material and is in the conductor tier or is directly against the conductor material of the conductor tier.

The etch stop material may comprise conductive material, insulative material, or semiconductive material (including any combination[s] thereof). Example conductive materials include titanium nitride, tungsten nitride, tungsten, and cobalt. Example insulative materials include aluminum oxide and hafnium oxide. Example semiconductive materials include crystalline semiconductor material, such as one or more suitably doped silicon, germanium, and so-called III/V semiconductor materials (e.g., GaAs, InP, GaP, and GaN). Materials 17, 24, 77, and 47 may be patterned within array region 12 and/or elsewhere (not shown) when forming islands 95. Example islands 95 are shown as being laterally surrounded by insulative material 80 (e.g., silicon dioxide and/or silicon nitride) that may, for example, be formed in TAV region 15 after forming islands 95.

FIGS. 4-6 show (a), with individual islands 95 having a top material 90 that is the etch-stop material and that is of different composition from all material that is vertically between the etch-stop material (90) and conductor material 17 (e.g., material 90 being of different composition from materials 77 and 24 of tiers 22z and 20z, respectively). FIG. 6 shows individual islands 95 as having non-vertical sidewalls and in one such embodiment where individual islands 95 are wider at their bottoms than at their tops in a vertical cross-section (e.g., that of FIG. 6). Alternately, such sidewalls could be vertical or wider at their tops than at their bottoms in a vertical cross-section (neither being shown in FIG. 6). FIGS. 4-6 do not show (b) [thus an embodiment comprising (a) and not (b)], with top material 90 of individual islands 95 being the etch-stop material but not having its top surface 91 in a vertical cross-section (e.g., that of FIG. 6) extending laterally-outward beyond two opposing laterally-outermost edges 94 of a top surface 93 of the different-composition material that is immediately directly below top material 90 (e.g., material 77 in tier 22z). In one such embodiment and as shown, individual islands 95 have top surface 91 of the etch-stop material in the vertical cross-section having opposing laterally-outermost edges 92 that are laterally-inward of two opposing laterally-outermost edges 94 of top surface 93 of the different composition material that is immediately directly below top material 90 (material 77 in tier 22z). Top material/etch-stop material 90, by way of example only, is shown as having its bottom surface in lowest first tier 22z.

Any other attribute(s) or aspect(s) as shown and/or described herein with respect to other embodiments may be used in the embodiments shown and described with reference to the above embodiments.

Figure 7:
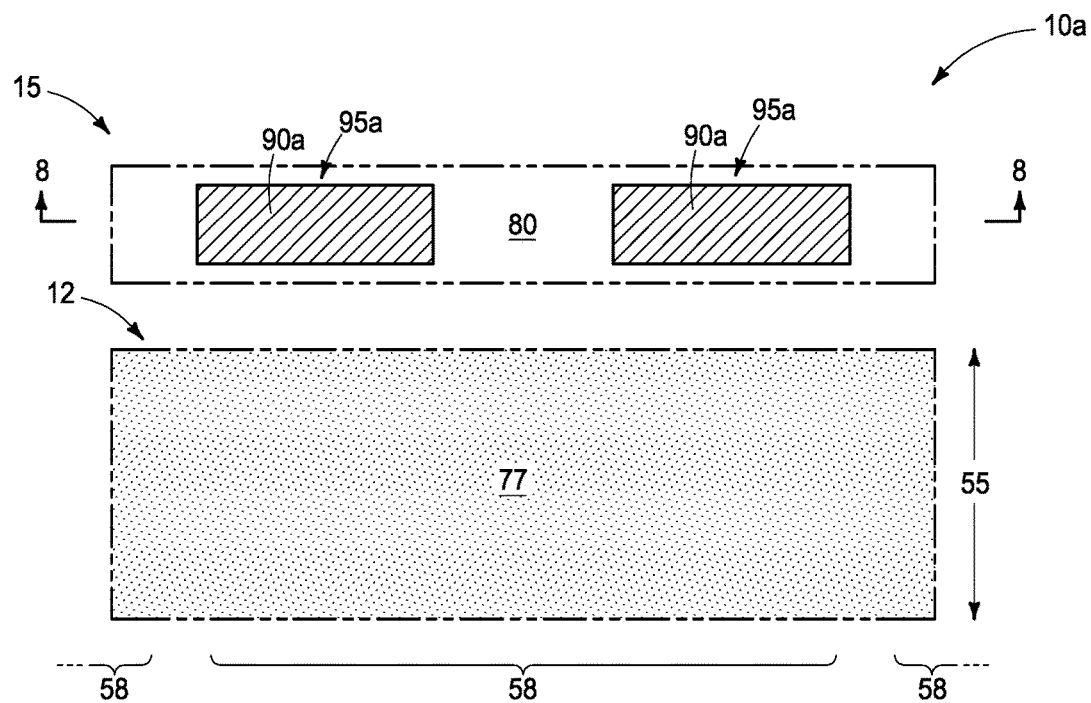
Figure 8:
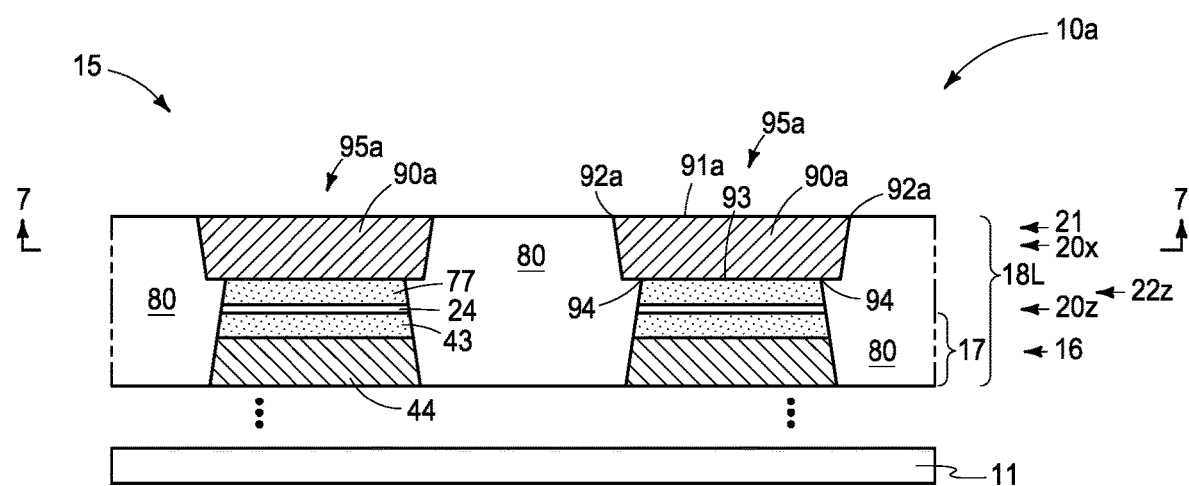

An alternate embodiment construction 10a comprising (a) and (b) is shown in FIGS. 7 and 8 (corresponding in cross-section to those of FIGS. 4 and 6, respectively). Like numerals from the above-described embodiments have been used where appropriate, with some construction differences being indicated with the suffix "a" or with different numerals. In construction 10a, top material 90a of individual islands 95a is the etch-stop material and has its top surface 91a in the vertical cross-section (e.g., that of FIG. 8) extending laterally-outward beyond two opposing laterally-outermost edges 94 of top surface 93 of the different-composition material that is immediately directly below top material 90a (material 77 in tier 22z). FIGS. 7 and 8 also show an embodiment comprising at least one of (a) and (b), with top material 90a being wider at its top than at its bottom in the vertical cross-section. Any other attribute(s) or aspect (s) as shown and/or described herein with respect to other embodiments may be used.

Figure 9:
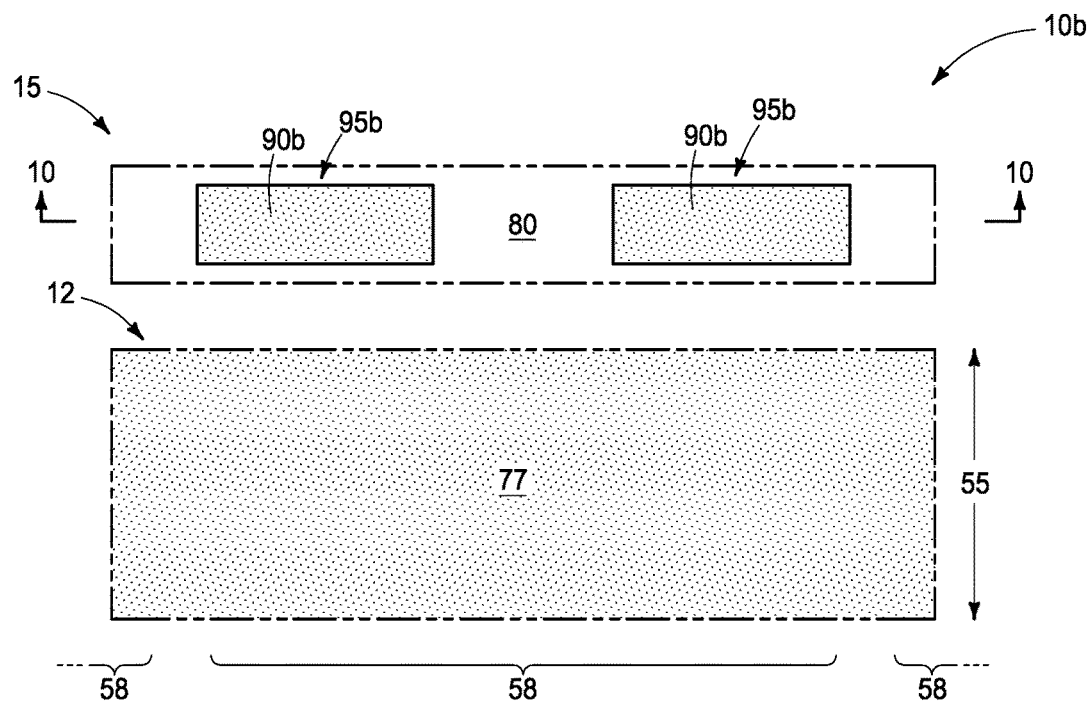
Figure 10:
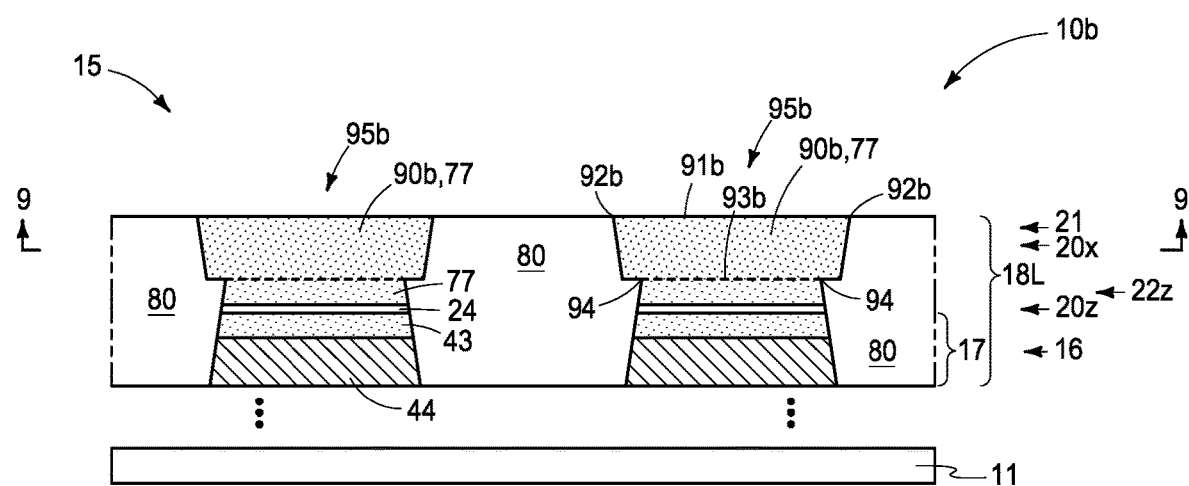

An alternate embodiment construction 10b comprising (b) and not (a) is shown in FIGS. 9 and 10 (corresponding in cross-section to those of FIGS. 7 and 8, respectively). Like numerals from the above-described embodiments have been used where appropriate, with some construction differences being indicated with the suffix "b" or with different numerals. In construction 10b, top material 90b of individual islands 95b is the etch-stop material and has its top surface 91b in a vertical cross-section (e.g., that of FIG. 10) extending laterally-outward beyond two opposing laterally-outermost edges 94 of top surface 93 of the material that is immediately directly below top material 90b (e.g., material 77 of tier 22z). The etch-stop material (e.g., 90b) at top surface 91b is of the same composition as some of the material that is vertically between the etch-stop material and conductor material 17 (e.g., material 77 in tier 22z). In one such embodiment, the same composition comprises polysilicon. Any other attribute(s) or aspect(s) as shown and/or described herein with respect to other embodiments may be used.

Figure 11:
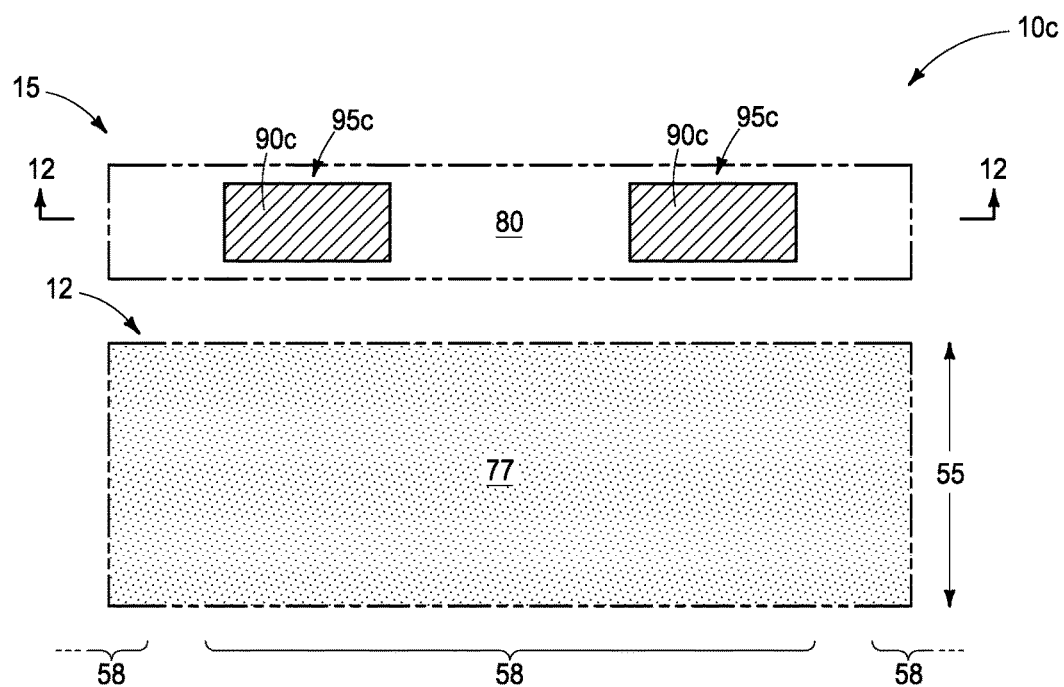
Figure 12:
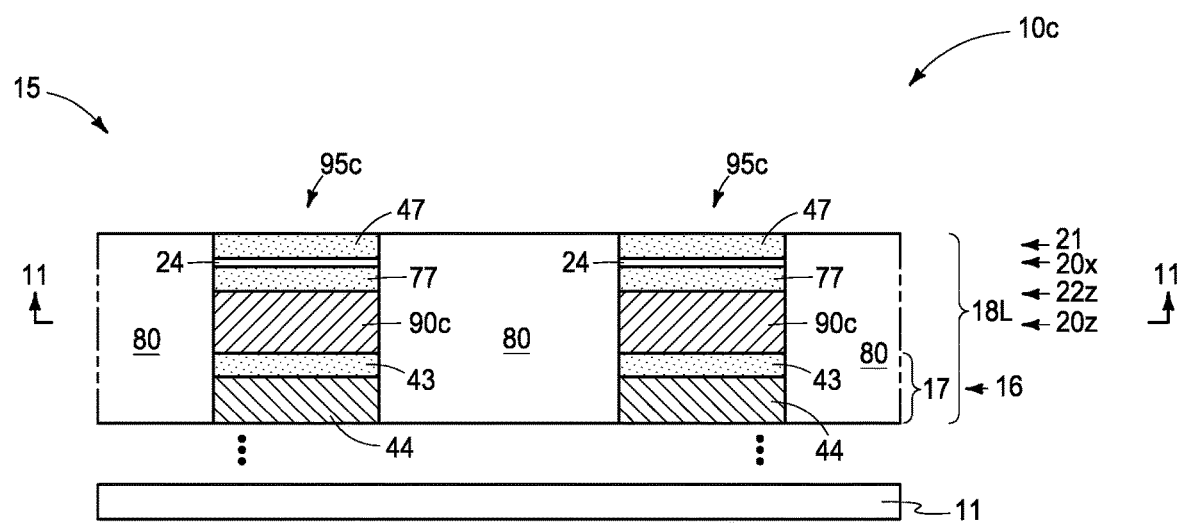
Figure 13:
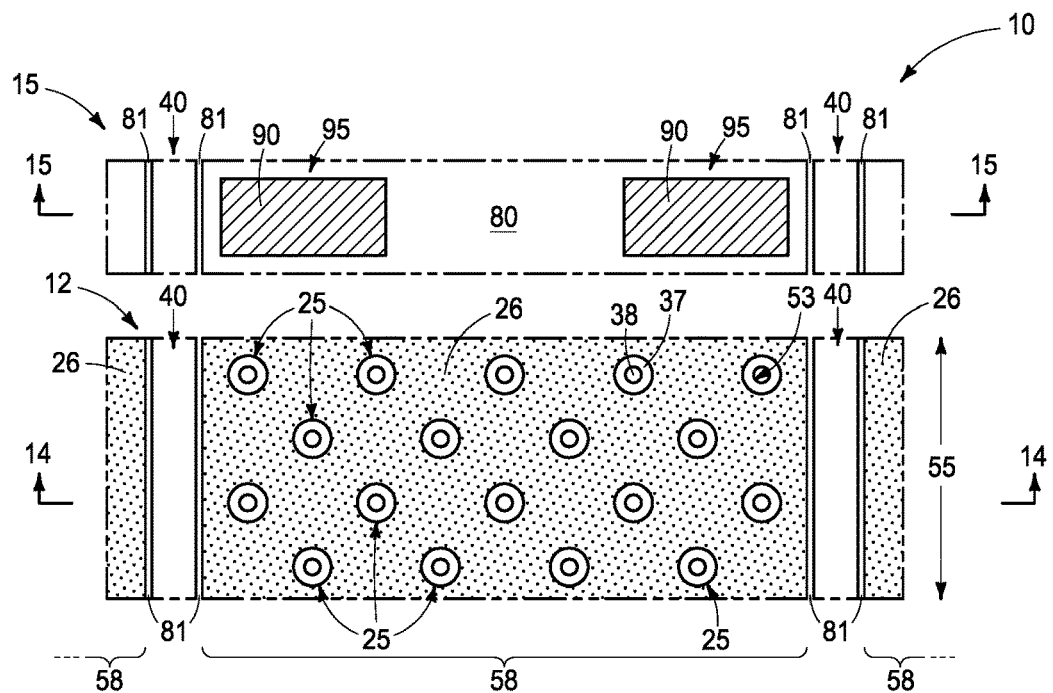
Figure 14:
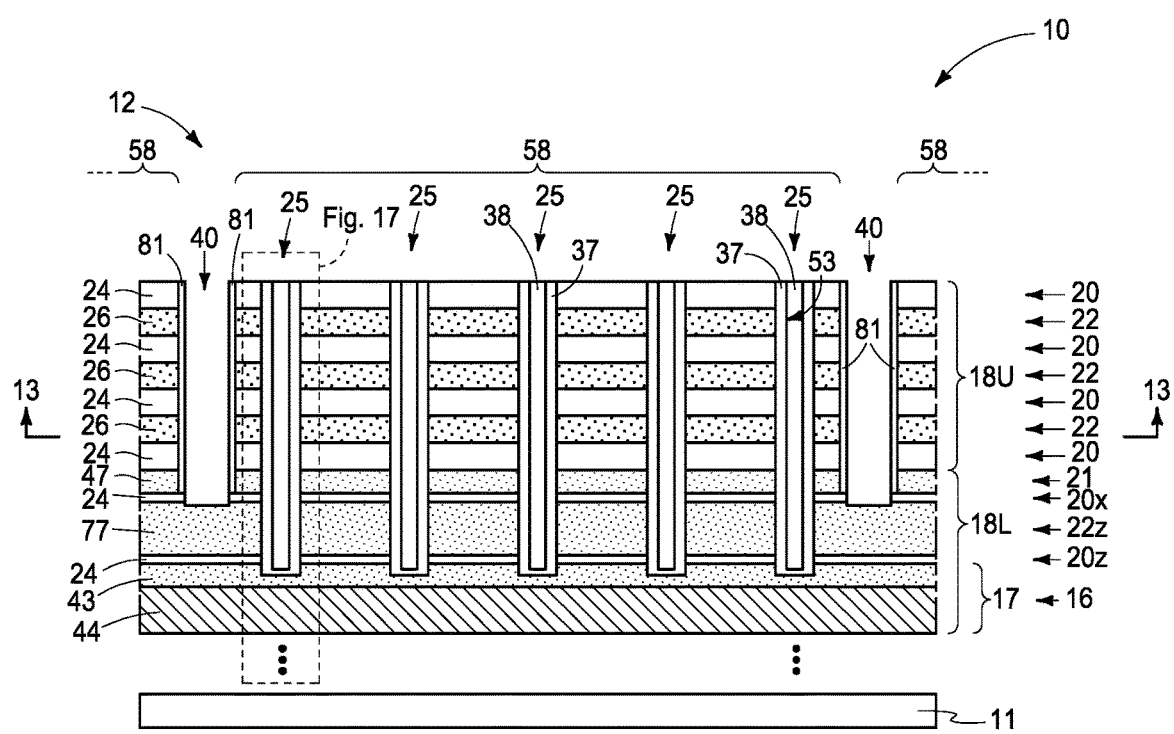
Figure 15:
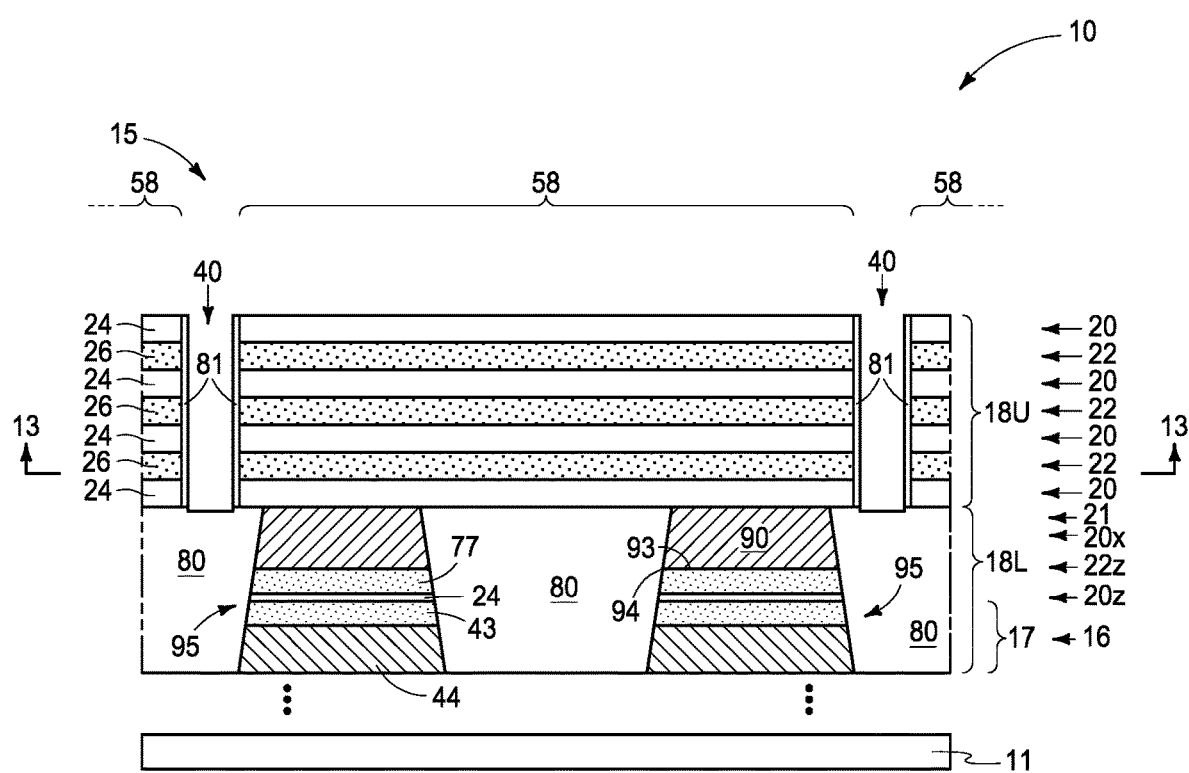
Figure 16:
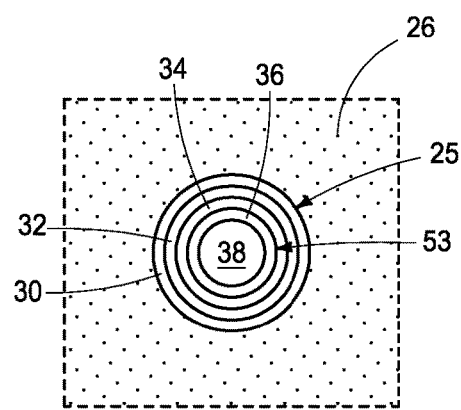
Figure 17:
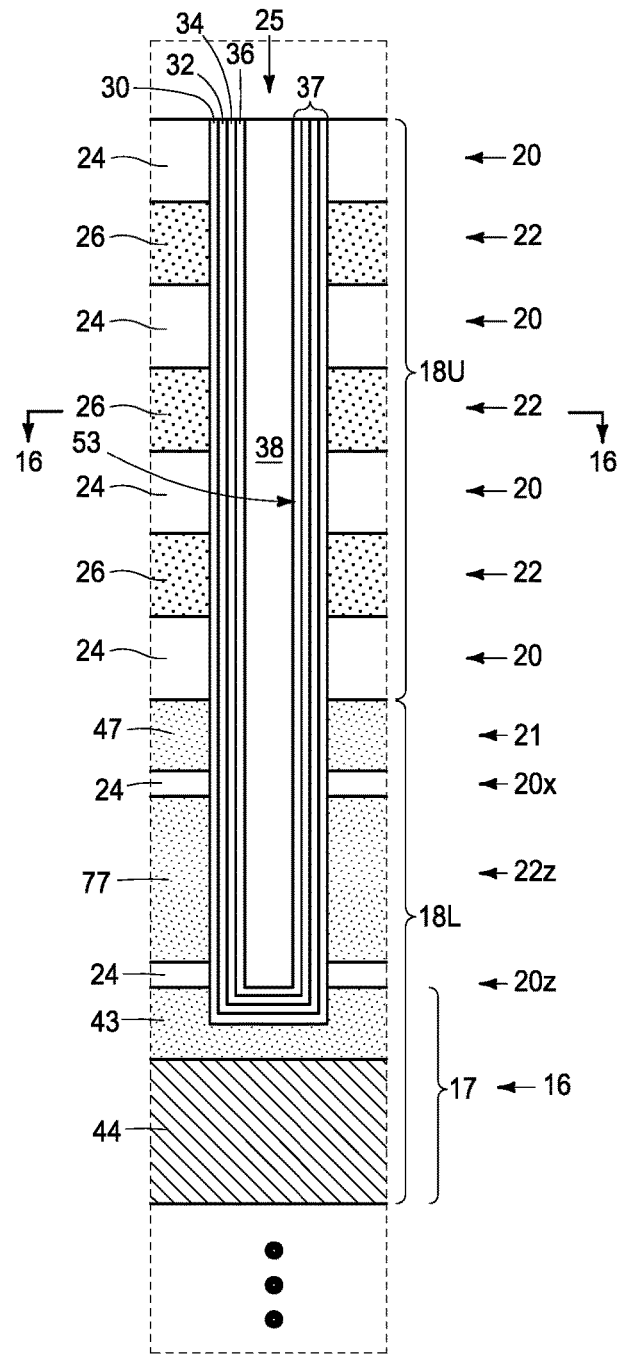

An alternate embodiment construction 10c comprising (c) is shown in FIGS. 11 and 12. Like numerals from the above-described embodiments have been used where appropriate, with some construction differences being indicated with the suffix "c" or with different numerals. In construction 10c, individual islands 95c have etch-stop material 90c of a different composition from that of an upper portion (e.g., material 43) of conductor material 17 and is directly against conductor material 17 of conductor tier 16. In one embodiment, and as shown, etch-stop material 90c is conductive and is directly against conductor material 17 of conductor tier 16. By way of example only, islands 95c are shown as having vertical sidewalls although non-vertical sidewalls may be used. Any other attribute(s) or aspect(s) as shown and/or described herein with respect to other embodiments may be used.

Example islands 95* may be formed using any existing or future-developed manners as the artisan will appreciate. For example, and by way of example only, materials of lower portion 18L as shown in FIG. 3 could be initially patterned to form initial islands 95*, with space there-around filled with insulative material 80 that is then planarized back at least to the top surface of material 47. Some of the one or more materials of the initially-formed islands would then be vertically and/or laterally recessed by etching, followed by filling the recesses formed thereby with material 90* and/or other materials there-above.

Referring to FIGS. 13-17, an upper portion 18U of stack 18* has been formed directly above lower portion 18L, with upper portion 18L being formed in TAV region 15 above islands 95 and in array region 12. Upper portion 18U comprises vertically-alternating different composition first tiers 22 (alternately referred to as conductive tiers) and second tiers 20 (alternately referred to as insulative tiers). Conductive tiers 22* may not comprise conducting material and insulative tiers 20* may not comprise insulative material or be insulative at this point in processing in conjunction with the hereby initially-described example method embodiment which is "gate-last" or "replacement-gate". First tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20 and first tiers 22 in upper portion 18U to conductor tier 16 (e.g., at least to lowest first tier 22z). Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Horizontally-elongated trenches 40 have been formed (e.g., by anisotropic etching) into stack 18* and that are individually between immediately-laterally-adjacent memory-block regions 58. Trenches 40 may taper laterally-inward in vertical cross-section moving deeper into stack 18. By way of example and for brevity only, channel openings 25 are shown as being arranged in groups or columns of staggered rows of four and five channel openings 25 per row. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other.

Trenches 40 as shown have been formed to extend to material 77 of lowest first tier 22z. As one example, trenches 40 may initially be formed by etching materials 24, 26, and 47 (likely using different anisotropic etching chemistries) and that stops on or within material 24 of next-lowest second tier 20x (when present). A thin sacrificial liner 81 (e.g., hafnium oxide, aluminum oxide, etc.) may then be formed, followed by punch-etching there-through to expose material 24, and followed by punch-etching through material 24 to expose material 77. Alternately, and by way of example only, a sacrificial etch-stop line (not shown) having the same general horizontal outline as trenches 40 may individually be formed in conducting tier 21 (when present) directly above and in contact with material 24 of next-lowest second tier 20x before forming upper portion 18U. Trenches 40 may then be formed by etching materials 24 and 26 to stop on or within the material of the individual sacrificial lines, followed by exhuming remaining material of such lines prior to forming thin sacrificial liner 81.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 13, 14, 16, and 17 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in FIGS. 13 and 14 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U and used analogous to the sacrificial etch-stop lines described above in forming trenches 40. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Figure 18:
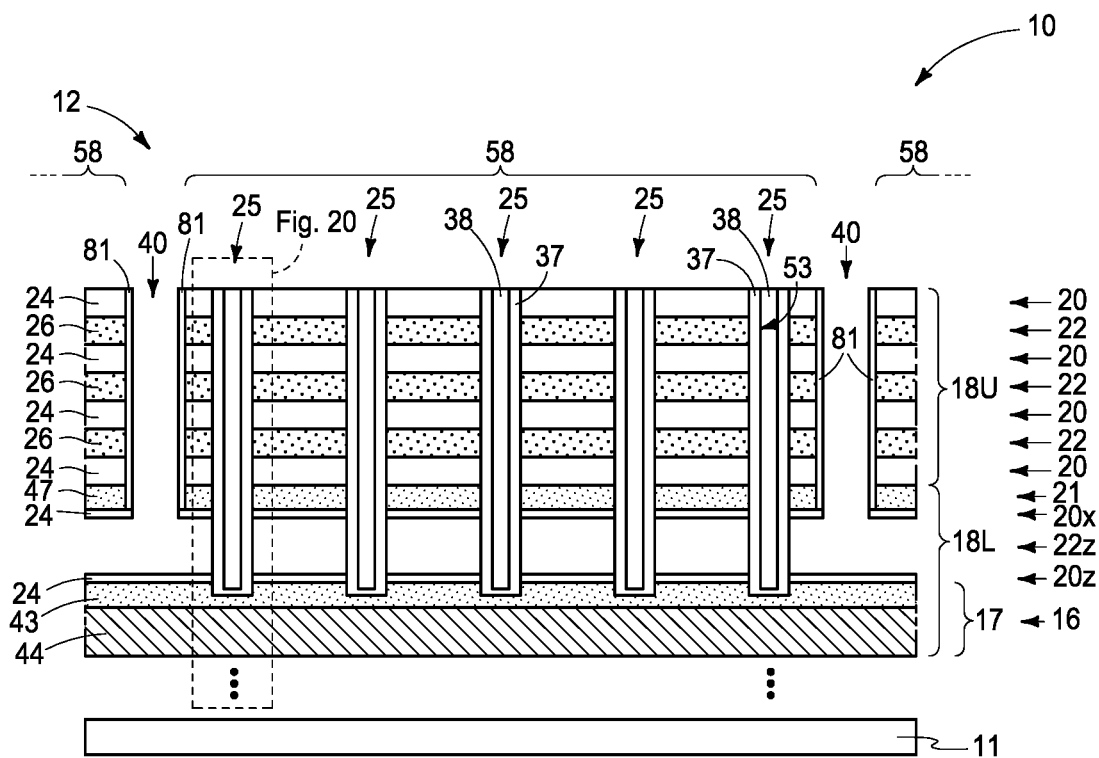
Figure 19:
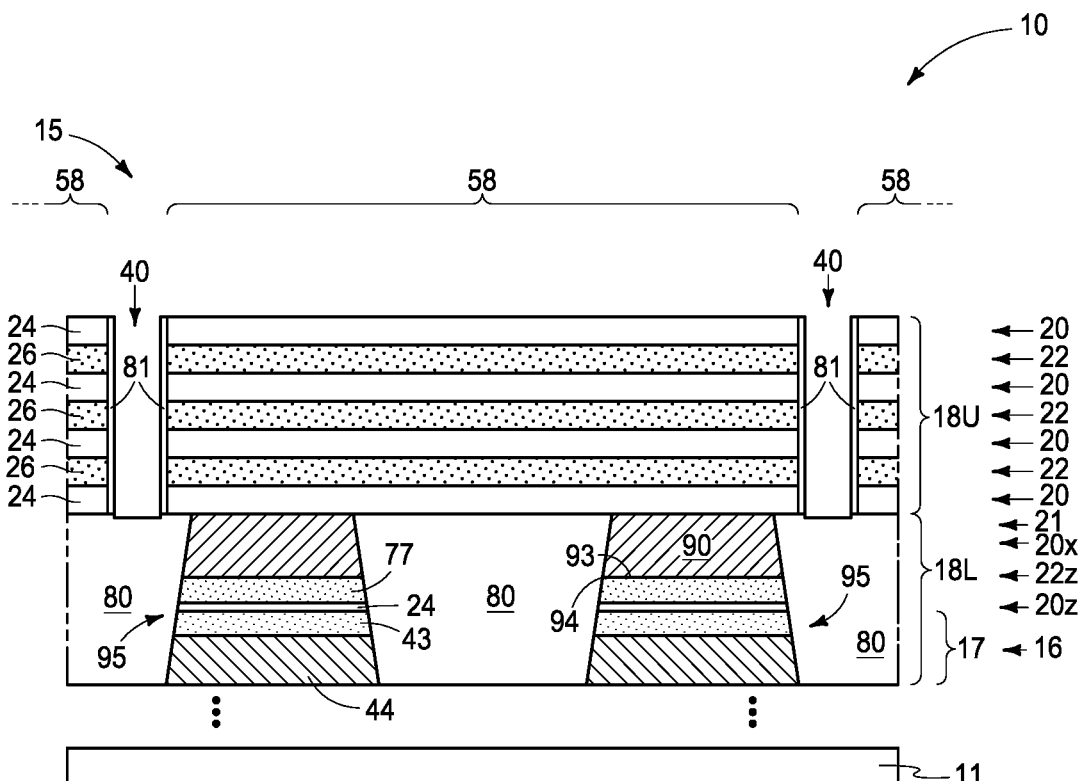
Figure 20:
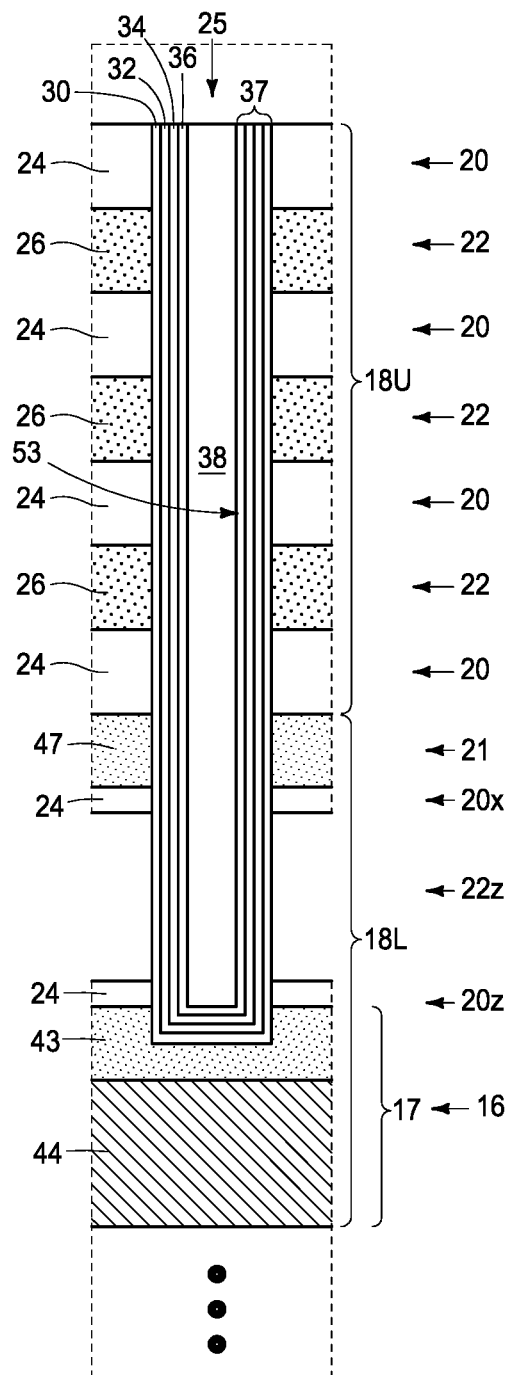

Referring to FIGS. 18-20, material 77 (not shown) has been isotropically etched from lowest first tier 22z through trenches 40 (e.g., using liquid or vapor $H_3PO_4$ as a primary etchant where material 77 is silicon nitride or using tetramethyl ammonium hydroxide [TMAH] where material 77 is polysilicon).

Figure 21:
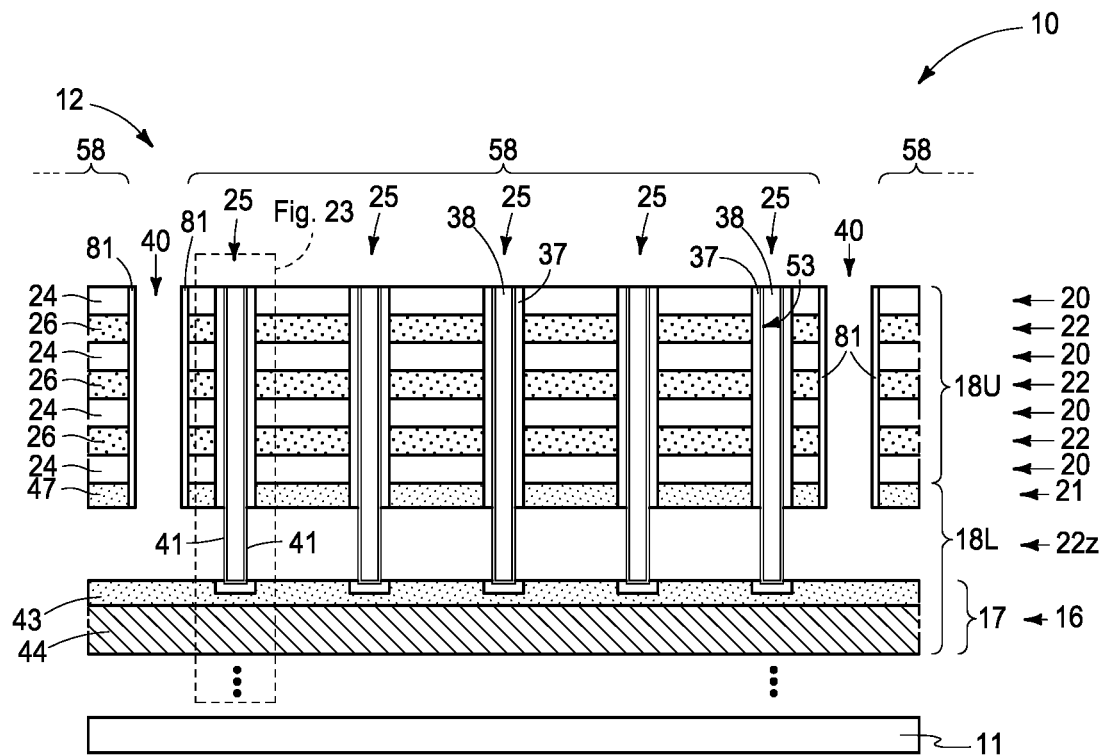
Figure 22:
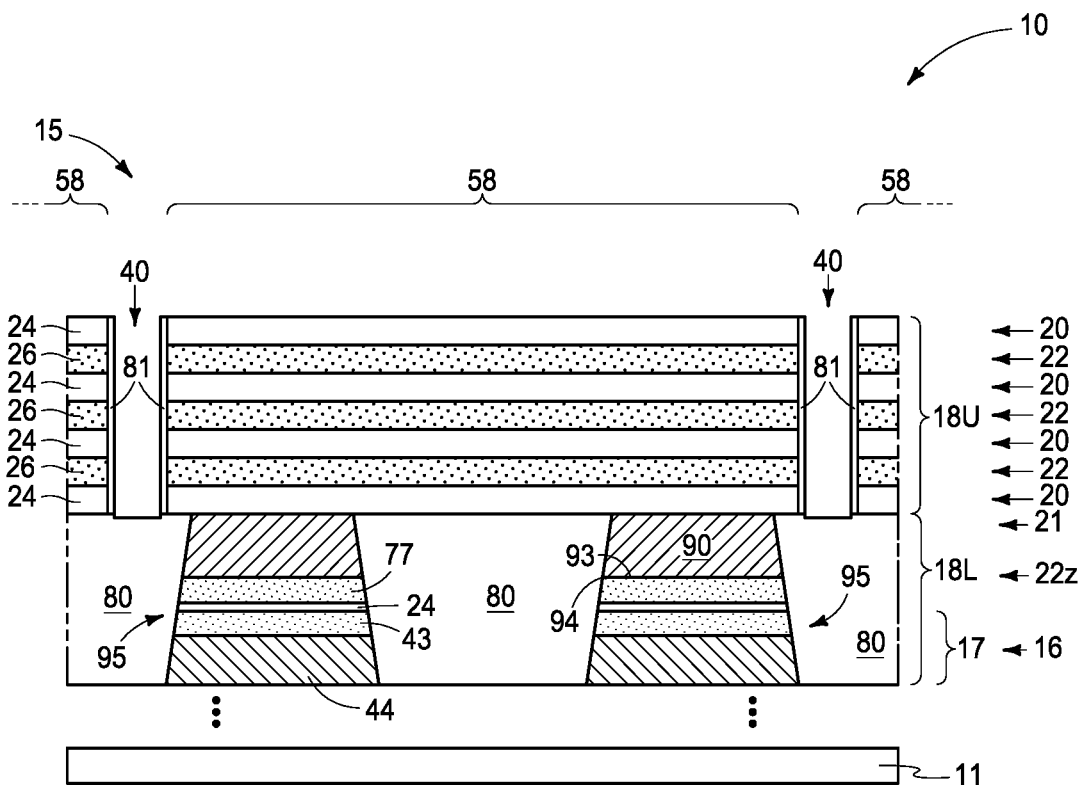
Figure 23:
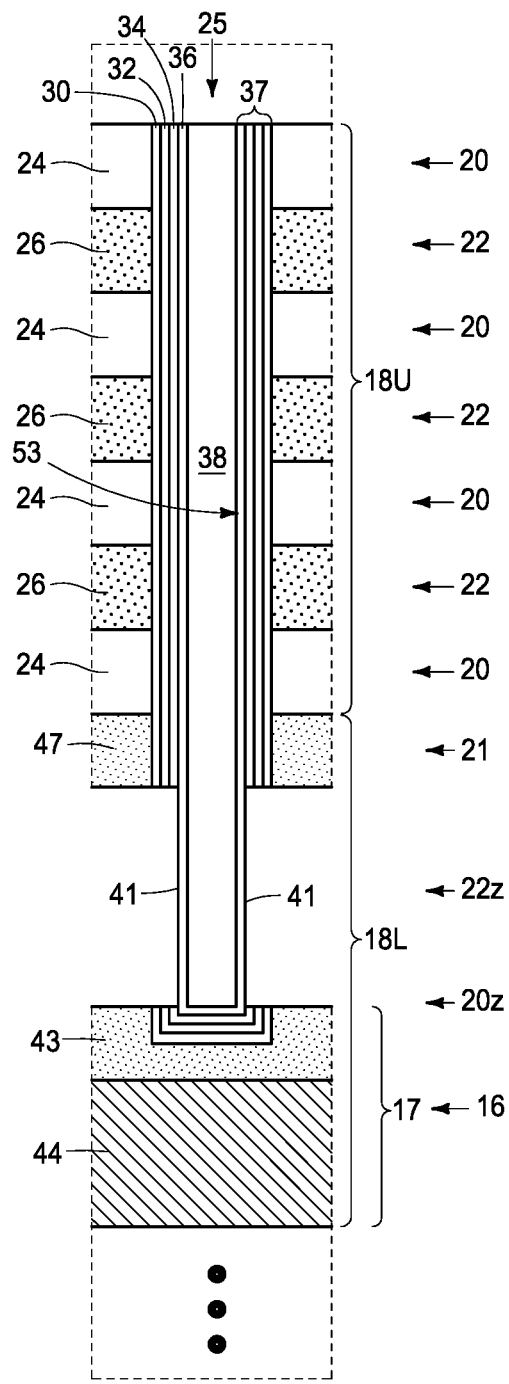

In example embodiments, conductive material is formed in the lowest first tier that directly electrically couples together the channel material of the individual channel-material strings and the conductor material of the conductor tier. Such conductive material may be formed directly against a bottom of the conducting material of the conducting tier and directly against a top of the conductor material of the conductor tier. For example, and first referring to FIGS. 21-23, such show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 21 and 23. The artisan is capable of selecting other chemistries for etching other different materials where a construction as shown in FIGS. 21 and 23 is desired. Some or all of insulative material (e.g., 24, and not shown in FIGS. 21 and 23) from tiers 20x and 20z (when present, and not shown as having been removed) may be removed when removing other materials, may be removed separately, or may partially or wholly remain (not shown). Further, some material 80 in FIG. 22 may be etched (not shown).

Figure 24:
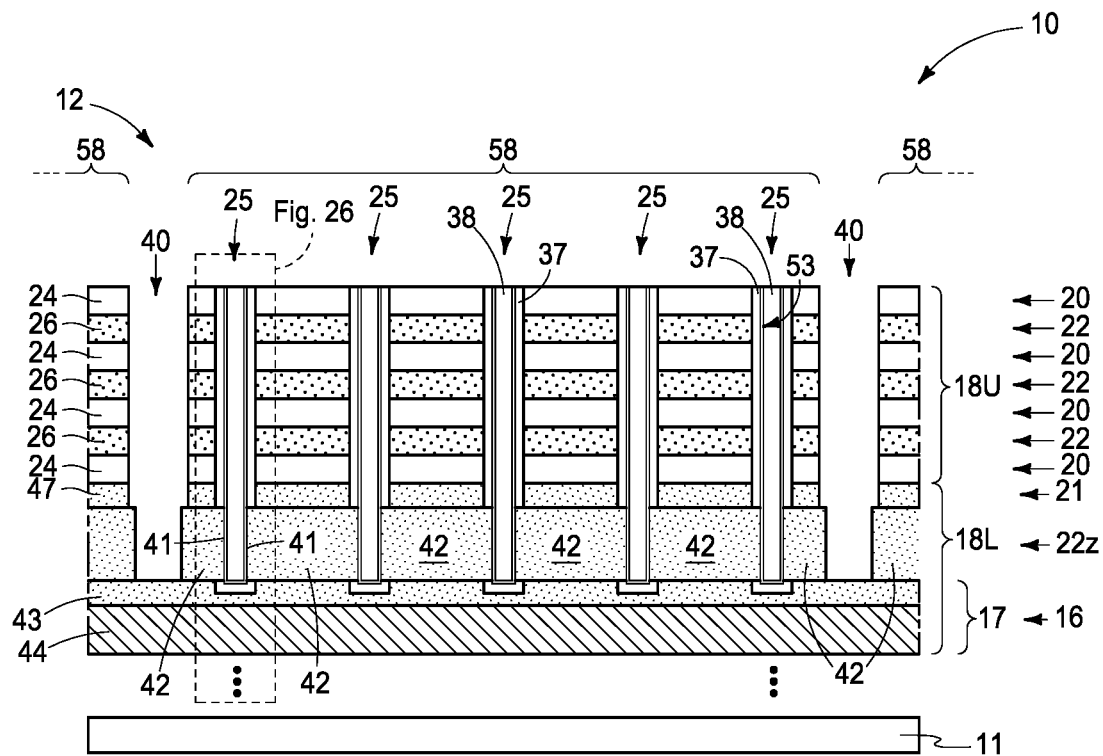
Figure 25:
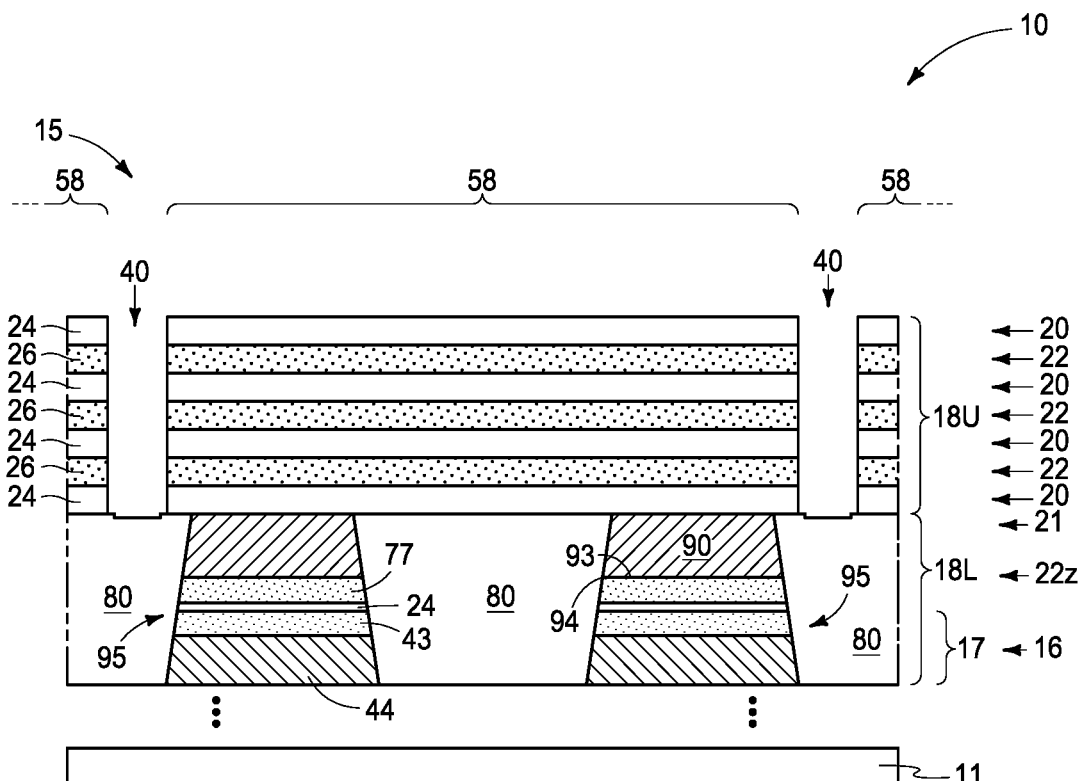
Figure 26:
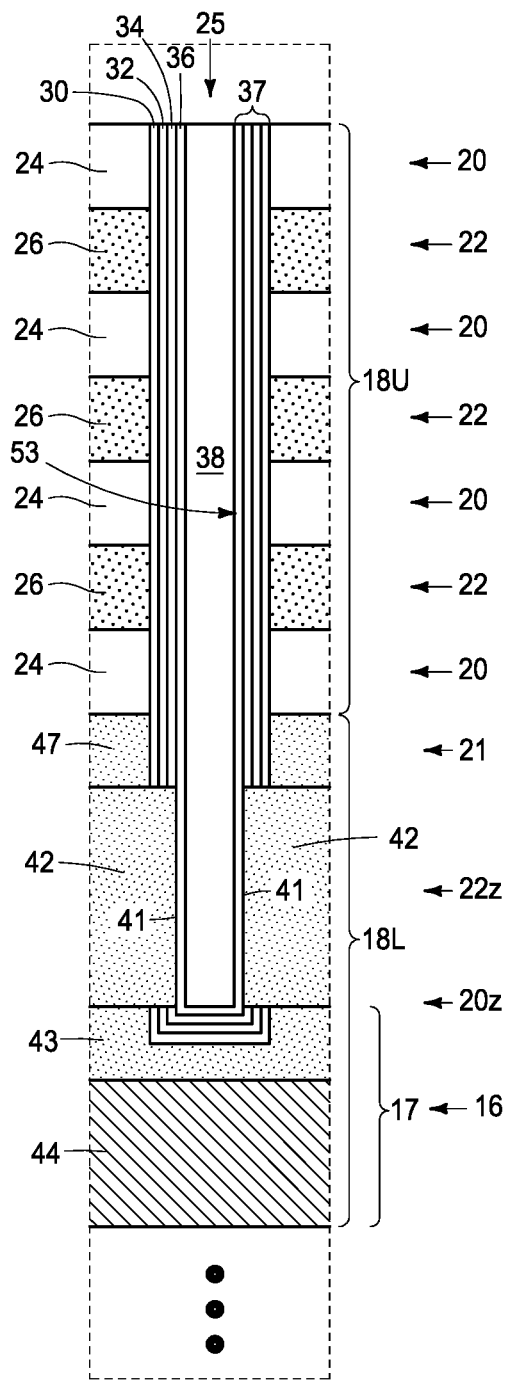

Referring to FIGS. 24-26, conducting material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting tier 21 and directly against a top of conductor material 43 of conductor tier 16, thereby directly electrically coupling together channel material 36 of individual channel-material strings 53 with conductor material 43 of conductor tier 16 and conducting material 47 of conducting tier 21. Subsequently, and by way of example, conducting material 42 has been removed from trenches 40 as has sacrificial liner 81 (not shown). Sacrificial liner 81 may be removed before forming conducting material 42 (not shown).

Figure 27:
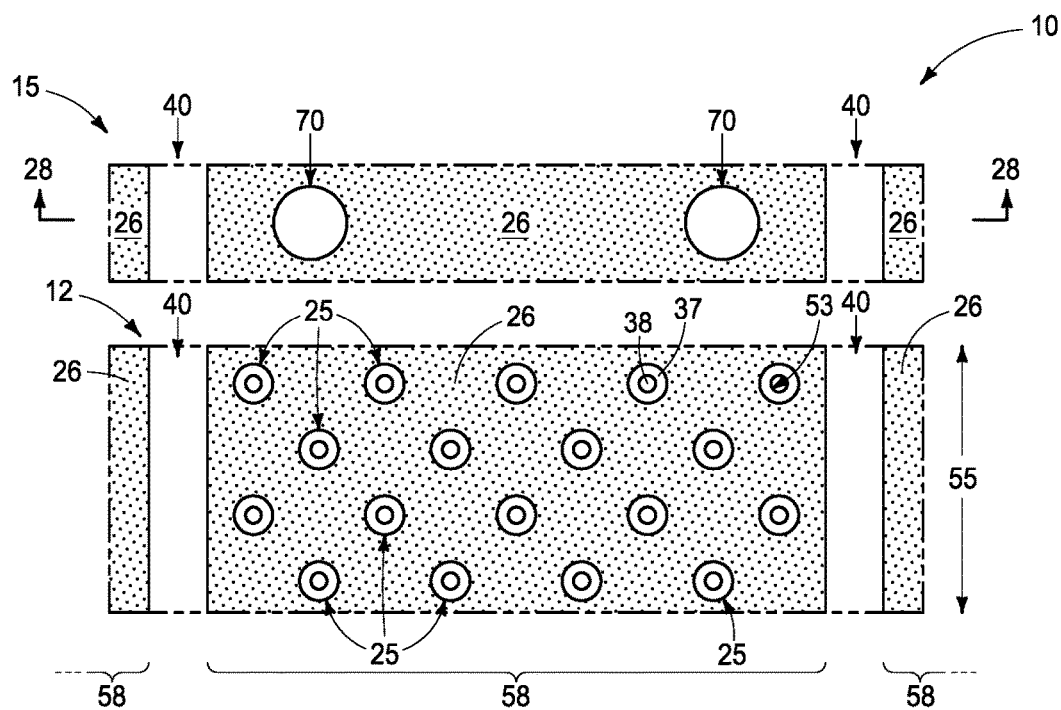
Figure 28:
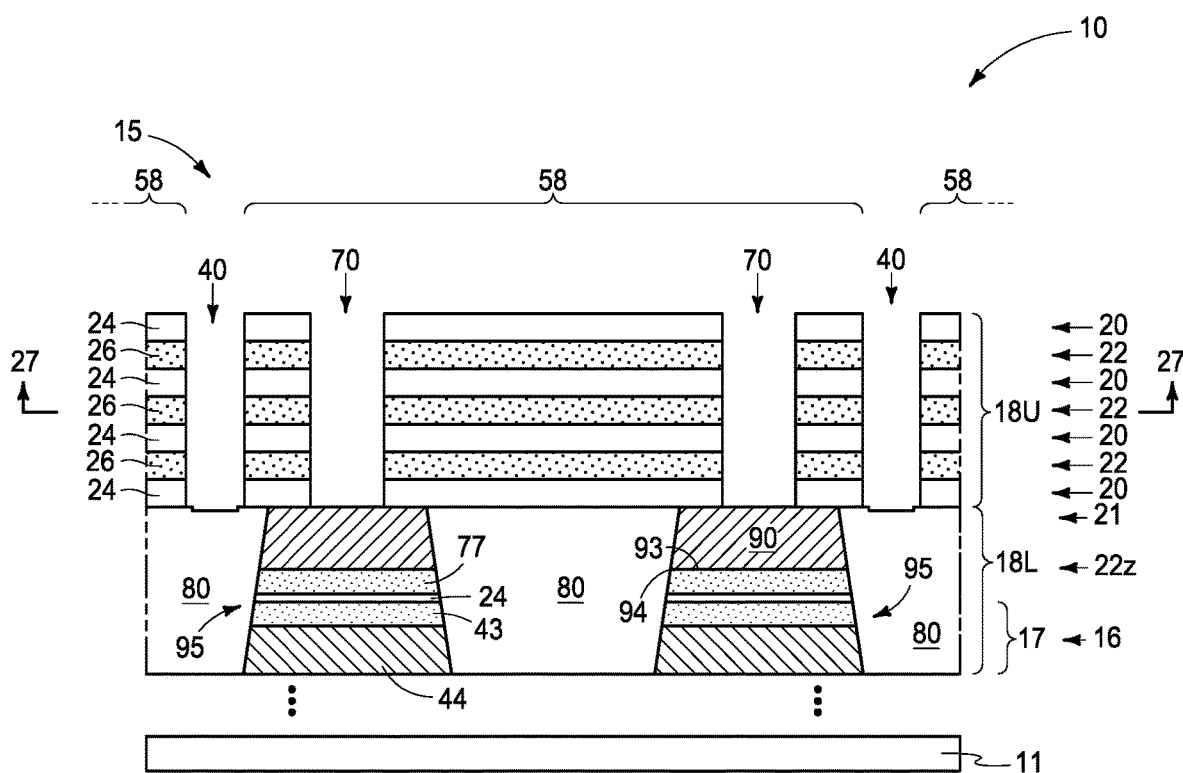

Referring to FIGS. 27 and 28, a TAV opening 70 has been formed in TAV region 15 through first tiers 22 and second tiers 20 (e.g., using photolithography and etch) to stop on etch-stop material 90 (i.e., atop or within) of individual islands 95. The artisan is capable of selecting suitable anisotropic etching chemistries to etch through materials 24 and 26 to ultimately stop relative to etch-stop material 90. Thereafter, and referring to FIG. 29, etching chemistry has been changed to etch etch-stop material 90 to extend TAV opening 70 there-through ideally to stop on conductor material 17 of conductor tier 16 (i.e., atop or within).

Figure 29:
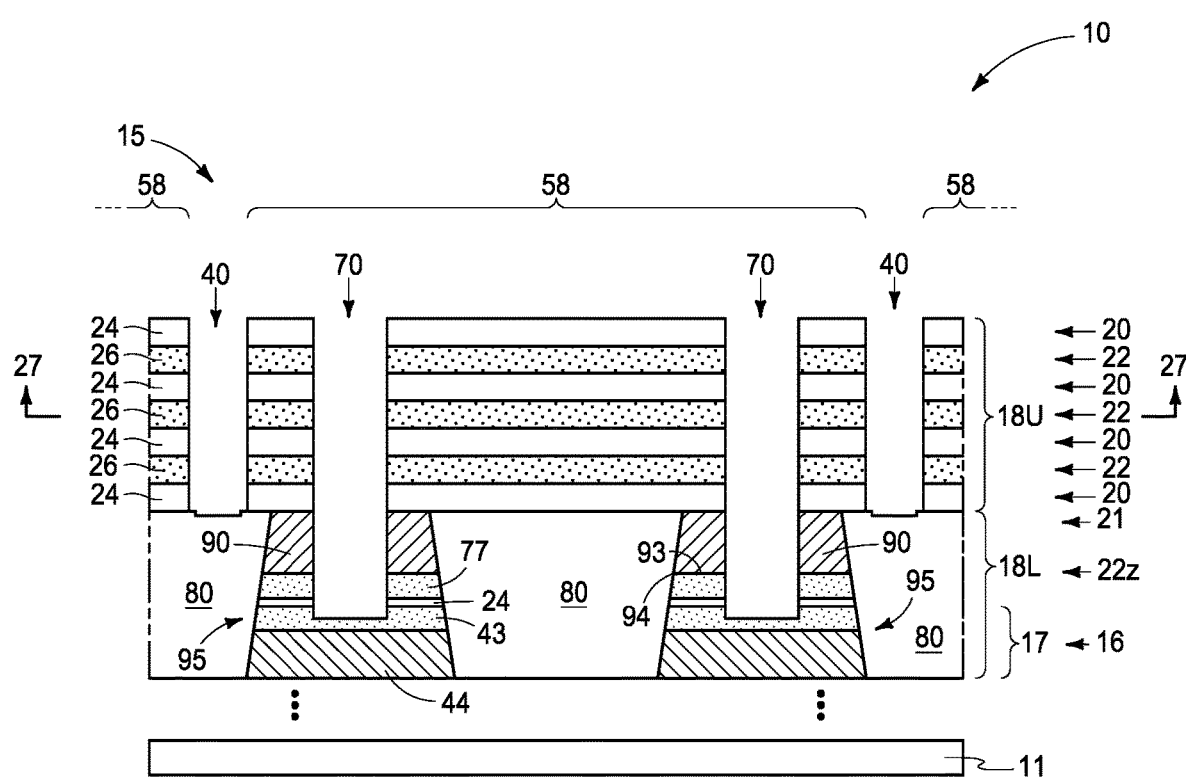
Figure 30:
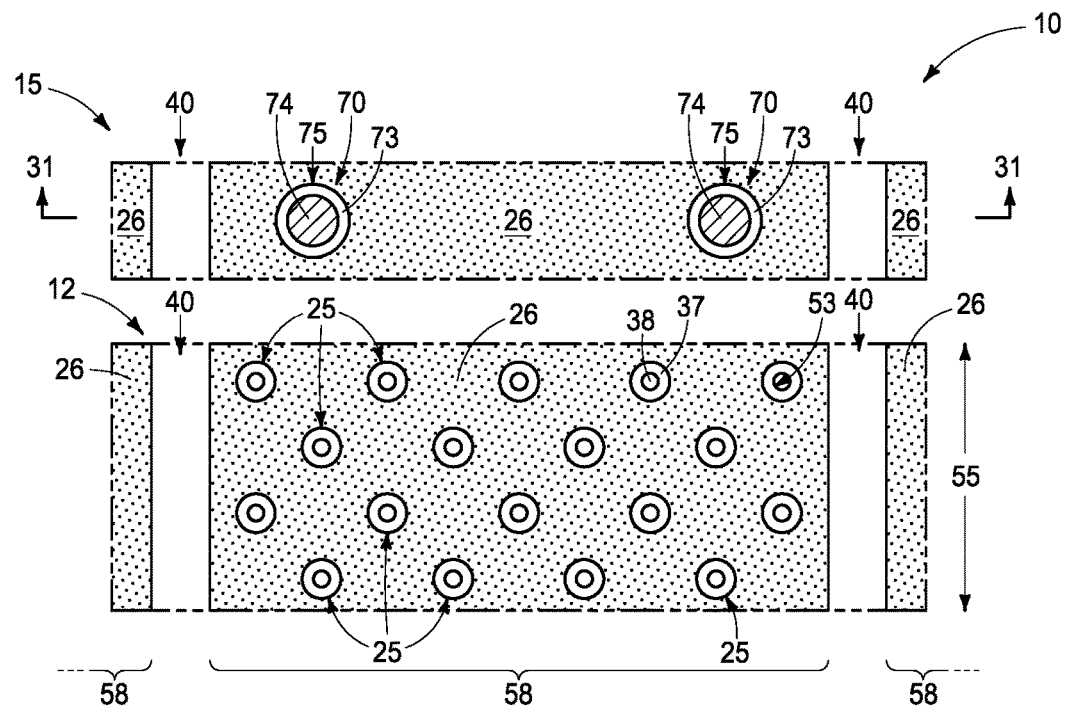
Figure 31:
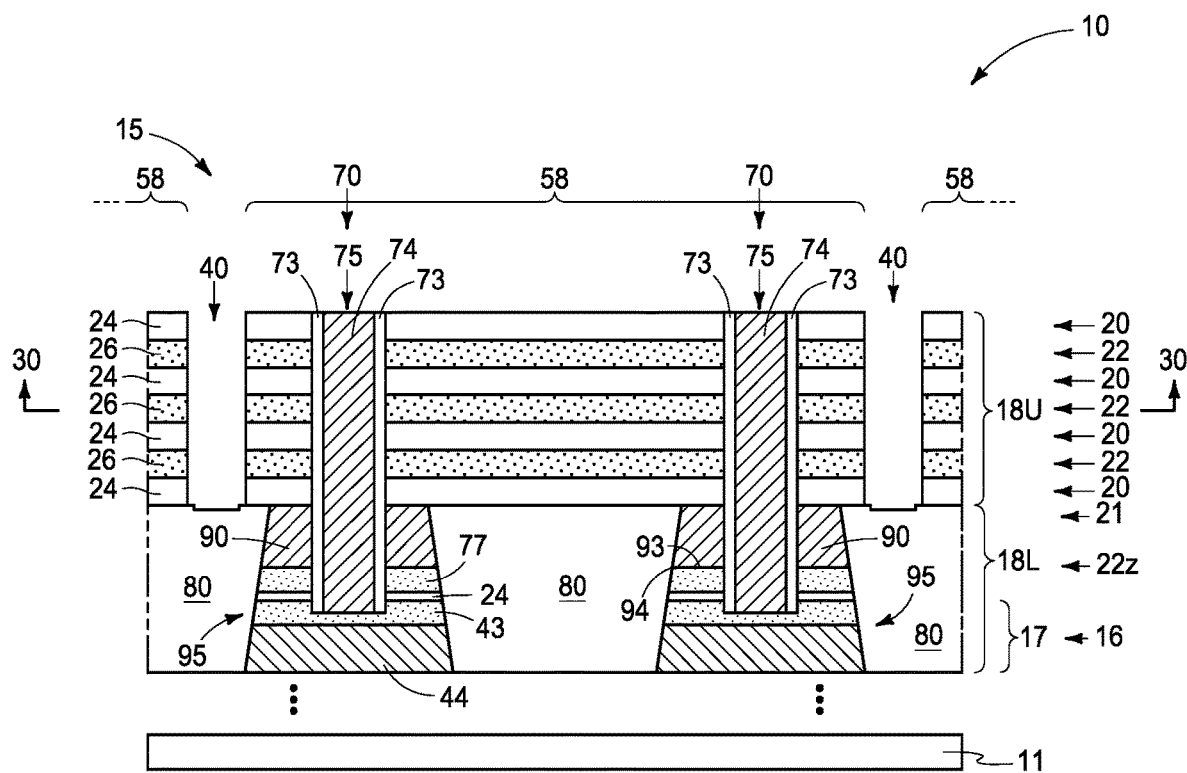
Figure 32:
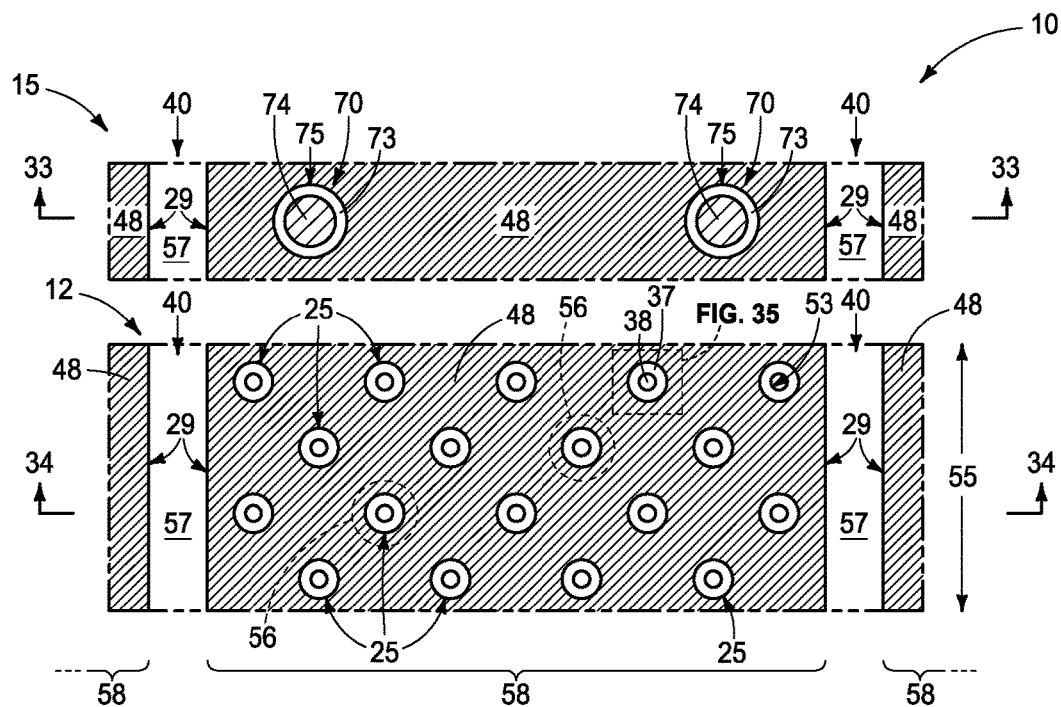
Figure 33:
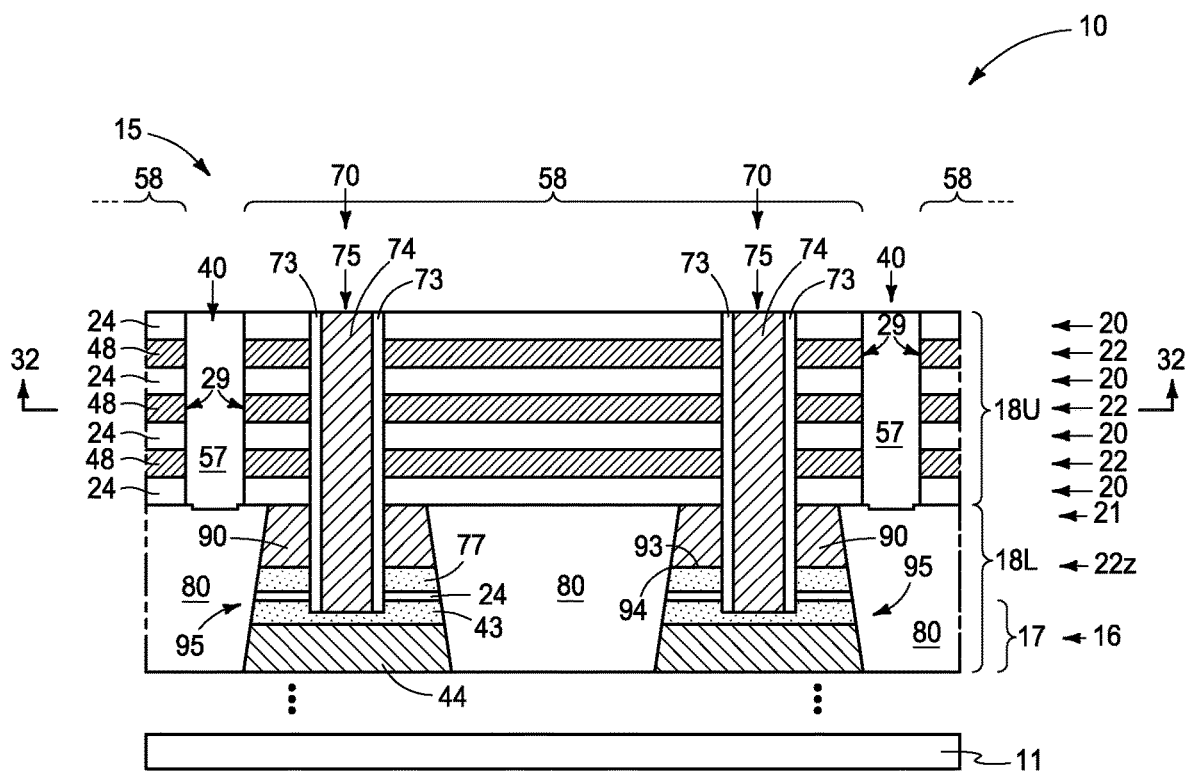
Figure 34:
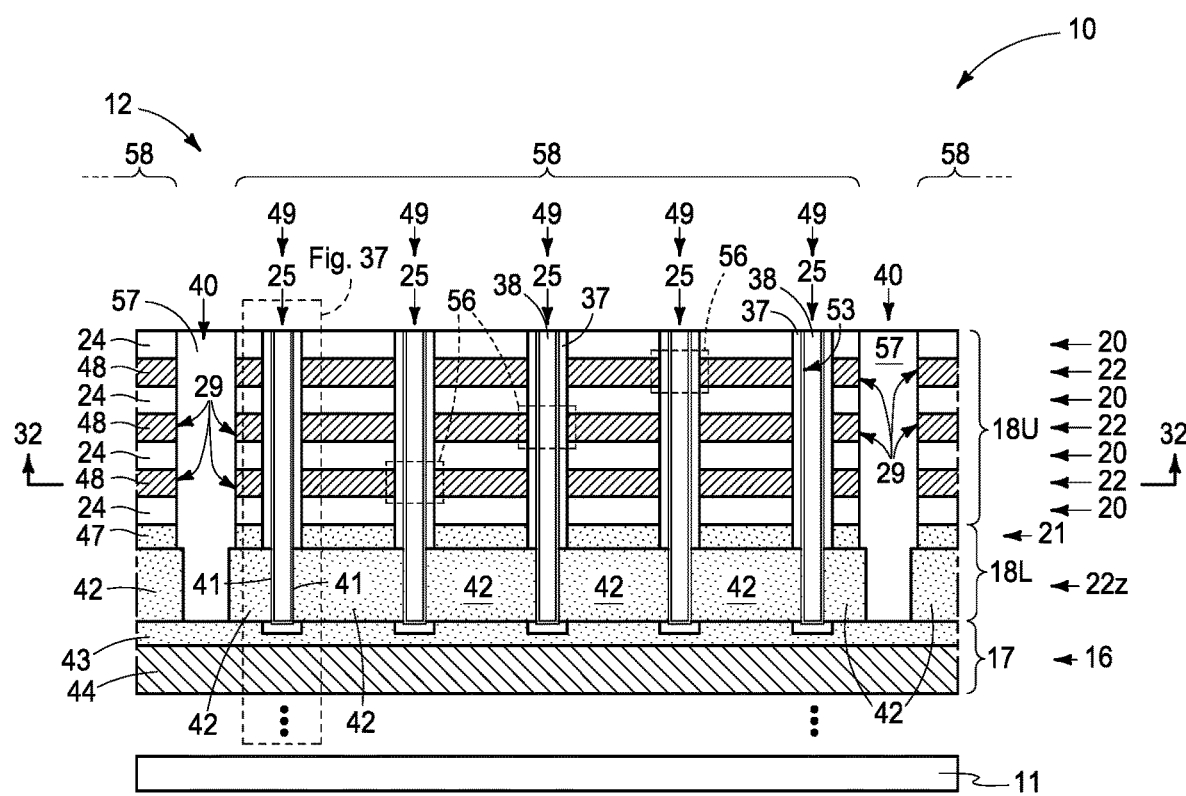
Figure 35:
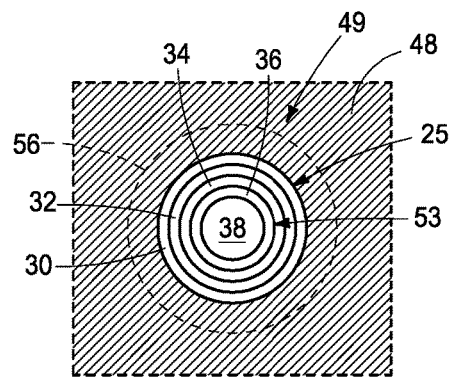
Figure 36:
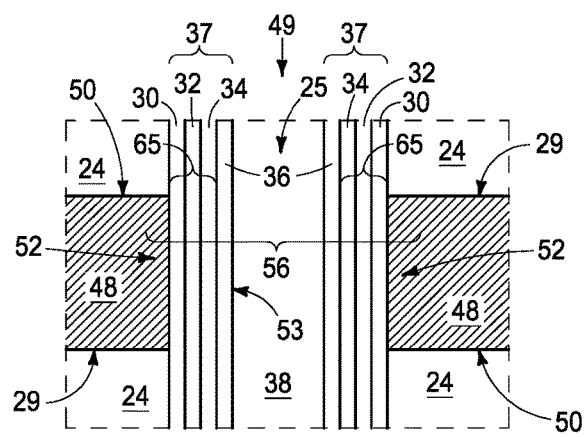
Figure 37:
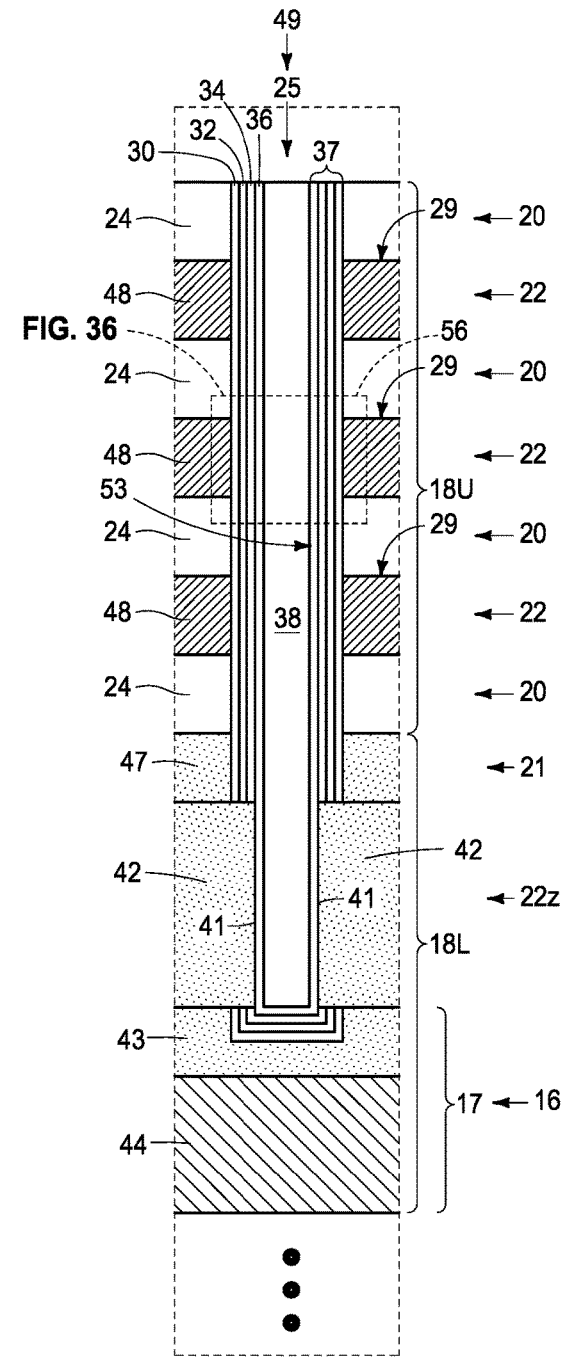

Referring to FIGS. 30 and 31, an operative TAV 75 has been formed in TAV opening 70 that directly electrically couples with conductor material 17 in conductor tier 16 of individual islands 90. In one example and as shown, operative TAV 75 comprises a laterally-outer or radially-outer insulative material 73 (e.g., $Al_2O_3$) and a conductive core 74 (e.g., metal material). By way of example only, TAV openings 70 in FIG. 29 are shown as stopping in upper conductor material 43. Alternately, such may extend there-through to lower conductor material 44 (not shown) whereby operative TAVs 75 extends to lower conductor material 44 (not shown). This may be desirable where, for example, lower conductor material 44 (e.g., metal material) is more conductive than upper conductor material 43 (e.g., conductively-doped polysilicon) for ultimately making better electrical connection (e.g., ohmic) to conductor material 17.

TAV openings 70 and/or operative TAVs 75 may be formed in any order relative to forming trenches 40, channel openings 25, and material(s) that may be therein. It may be desirable to form TAV openings 70 and operative TAVs 75 therein prior to forming trenches 40 to preclude masking thereof while forming operative TAVs 75 or masking of operative TAVs 75 thereafter to remove TAV material that may be formed in trenches 40. Further, when forming operative TAVs 75 before forming trenches 40, operative TAVs 75 may provide tier support in staircase regions (not shown) and crests (not shown) therein during replacement of material 26 with material 48 when using a replacement-gate process. Regardless, one or more dummy TAV's (e.g., 75) may also be formed in one or more TAV openings 70.

Analogous processing may be conducted relative to constructions 10a, 10b, and 10c. In one embodiment with respect to a construction like 10c and where etch-stop material 90c is conductive, the processing may be devoid of etching the TAV opening to extend it through the etch-stop material when a conductive etch-stop material 90c is directly against conductor material 17 of conductor tier 16. Any other attribute(s) or aspect(s) as shown and/or described herein with respect to other embodiments may be used.

Referring to FIGS. 32-37, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conducting lines 29 (e.g., wordlines) and elevationally-extending strings 49 of individual transistors and/or memory cells 56 in array region 12 and that directly electrically couple to conductor material 17 in conductor tier 16.

A thin insulative liner (e.g., $Al_2O_3$ and not shown) may be formed before forming conducting material 48. Approximate locations of transistors and/or memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 36) corresponding to control-gate regions 52 of individual transistors and/or memory cells 56. Control-gate regions 52 in the depicted embodiment comprise individual portions of individual conducting lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25/27 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped polysilicon" is polysilicon having from 0 atoms/cm$^3$ to $1 \times 10^{12}$ atoms/cm$^3$ of atoms of conductivity-increasing impurity. "Doped polysilicon" is polysilicon that has more than $1 \times 10^{12}$ atoms/cm$^3$ of atoms of conductivity-increasing impurity and "conductively-doped polysilicon" is polysilicon that has at least $1 \times 10^{18}$ atoms/cm$^3$ of atoms of conductivity-increasing impurity. Intervening material 57 may include through array vias (not shown).

TAV openings 70 and TAVs 75 therein may be formed after forming conducting material 48 (e.g., including in a gate-first process). Further, for example in a gate-last process, material 26 in tiers 22 in TAV region 15 may not be sufficiently exposed when etching away material 26 elsewhere such that little if any of such is removed such that little if any conducting material 48 is formed laterally proximate TAVs 75s (not shown).

Any other attribute(s) or aspect(s) as shown and/or described herein with respect to other embodiments may be used.

Figure 38:
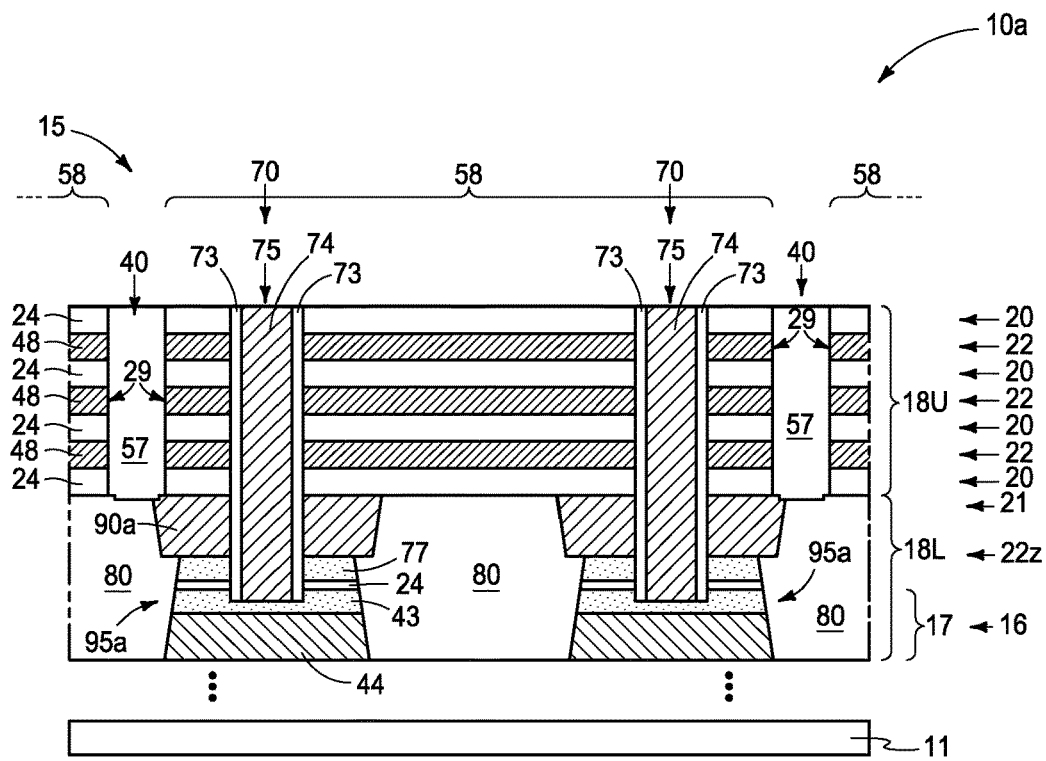
Figure 39:
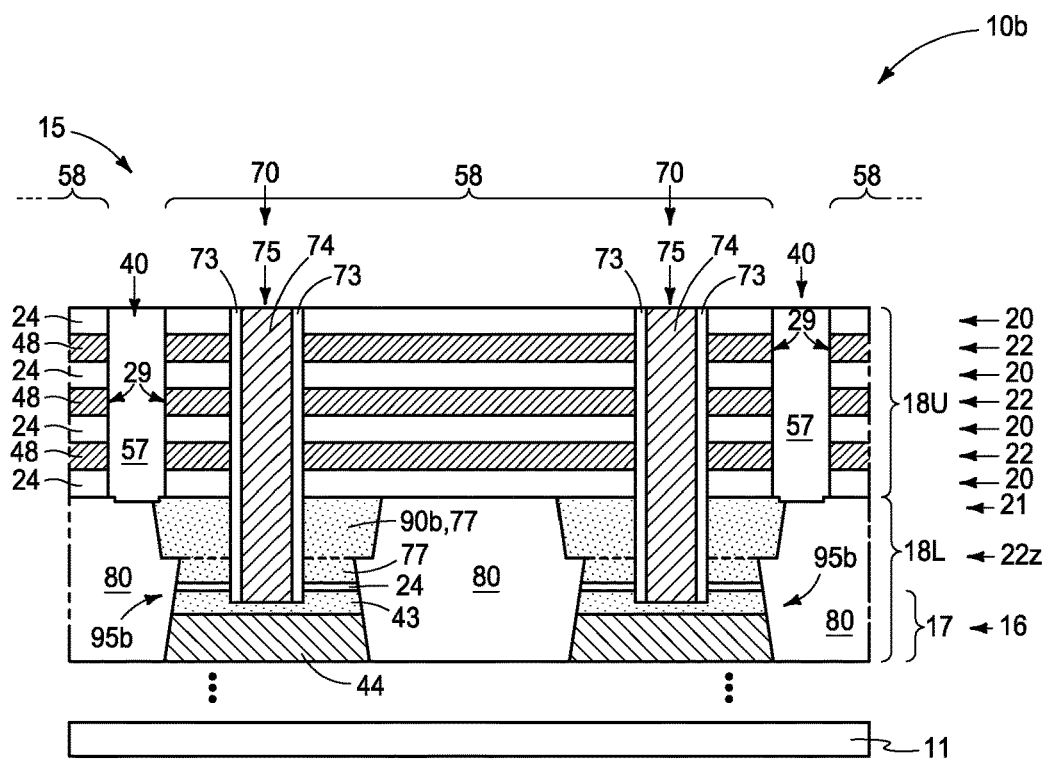
Figure 40:
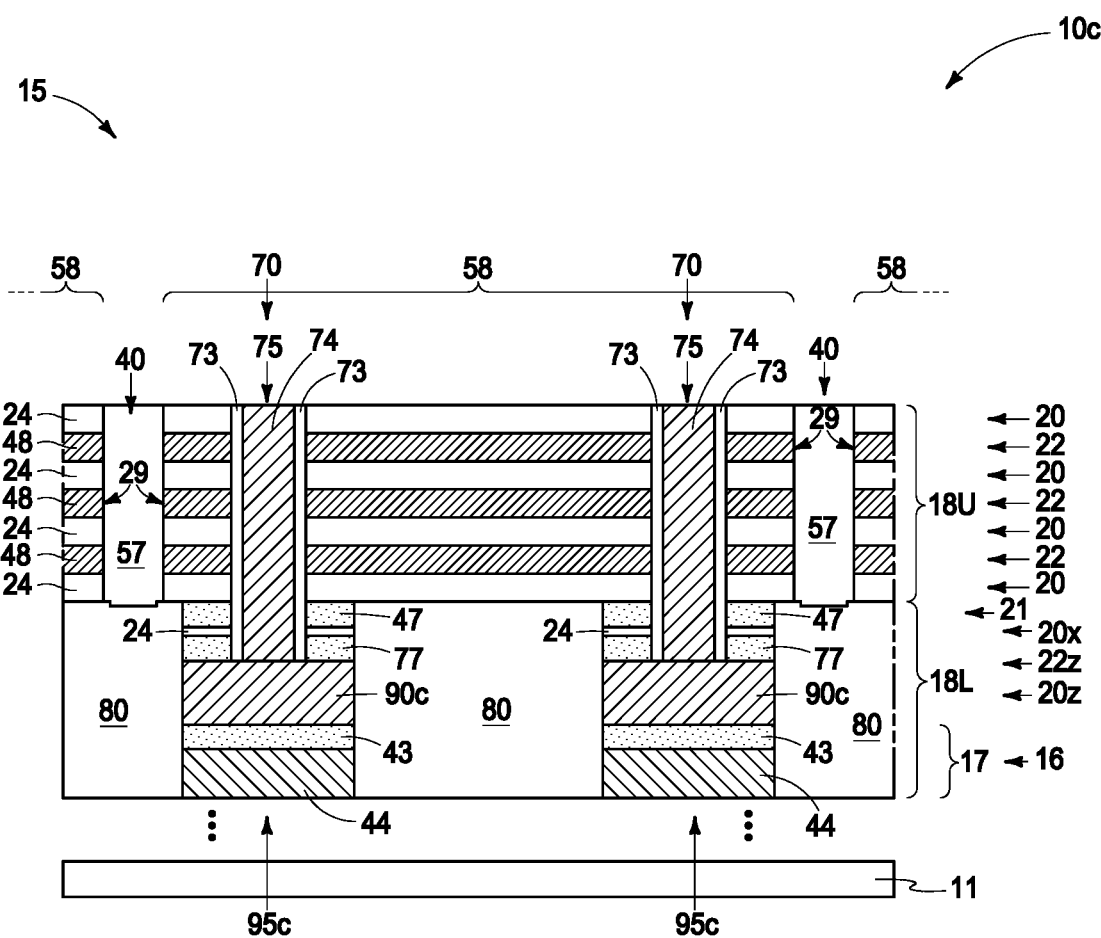

FIGS. 38, 39, and 40 show example finished constructions 10a, 10b, and 10c, respectively. FIG. 40 presumes material 90c is conductive, with such example method being devoid of etching TAV opening 70 to extend it though material 90c. If material 90c is insulative or semiconductive, TAV opening 70 may be etched through material 90c prior to forming at least example material 74. Any other attribute(s) or aspect(s) as shown and/or described herein with respect to other embodiments may be used In one embodiment, a method used in forming a conductive via (e.g., 75) comprises forming islands (e.g., 95*) individually comprising conductor material (e.g., 17) and multiple different composition materials there-above (e.g., 24, 77/47). Individual of the islands comprise an etch-stop material (e.g., 90*). The etch-stop material comprises at least one of (a), (b), or (c), where:
  (a): the individual islands having a top material that is the etch-stop material and that is of different composition from all material that is vertically between the etch-stop material and the conductor material;
  (b): the top material of the individual islands being the etch-stop material and having its top surface in a vertical cross-section extending laterally-outward beyond two opposing laterally-outermost edges of a top surface of the material that is immediately directly below the top material; and
  (c): is of different composition from that of an upper portion of the conductor material and including a portion thereof that is elevationally coincident with the conductor material or that is directly against the conductor material;

Upper-portion material (e.g., 24, 26 of 18U) is formed directly above the islands. A via opening (e.g., 70) is etched through the upper-portion material to stop on the etch-stop material of the individual islands. An operative conductive via (e.g., 75) is formed in the via opening that directly electrically couples with the conductor material of the individual islands. Any other attribute(s) or aspect(s) as shown and/or described herein with respect to other embodiments may be used.

Using an etch-stop material in the various embodiments as described above may reduce or eliminate risk of the etching of TAV openings 70 going through materials therebelow and into operative circuit components that are below conductor tier 16.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*). Channel-material strings (e.g., 53*) of memory cells (e.g., 56) extending through the insulative tiers and the conductive tiers. Through-array-vias (TAVs; e.g., 75*) extend through the insulative tiers and the conductive tiers to be directly against conductor material (e.g., 17) of islands (e.g., 95*). The islands comprise multiple different composition materials directly above the conductor material (e.g., 24, 77, 90*). Apart from the TAVs, the islands individually comprise at least one of (a), (b), or (c), where:
  (a): a top material (e.g., 90*) that is of different composition from all material that is vertically between the top material and the conductor material;
  (b): the top material having its top surface (e.g., 91*) in a vertical cross-section extending laterally-outward beyond two opposing laterally-outermost edges (e.g., 94) of a top surface (e.g., 93) of the different-composition material that is immediately directly below the top material (e.g., 77); and
  (c): is of different composition from that of an upper portion of the conductor material and including a portion thereof that is elevationally coincident with the conductor material or that is directly against the conductor material.

Any other attribute(s) or aspect(s) as shown and/or described herein with respect to other embodiments may be used.

In one embodiment, integrated circuitry comprises vertical conductive vias (e.g., 75*) individually having a lower portion thereof that is directly against conductor material (e.g., 17) of islands (e.g., 95*). The islands comprise multiple different composition materials directly above the conductor material (e.g., 24, 77, 90*). Apart from the conductive vias, the islands individually comprising at least one of (a), (b), or (c), where:
- (a): a top material (e.g., 90*) that is of different composition from all material that is vertically between the top material and the conductor material;
- (b): the top material having its top surface (e.g., 91*) in a vertical cross-section extending laterally-outward beyond two opposing laterally-outermost edges (e.g., 94) of a top surface (e.g., 93) of the different-composition material that is immediately directly below the top material (e.g., 77); and
- (c): is of different composition from that of an upper portion of the conductor material and including a portion thereof that is elevationally coincident with the conductor material or that is directly against the conductor material.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a lower portion of a stack comprising a through-array-via (TAV) region and an array region. The lower portion comprises a conductor tier comprising conductor material and multiple different composition materials directly above the conductor tier. Islands are formed in the TAV region. Individual of the islands comprise the conductor material of the conductor tier and the multiple different composition materials there-above. The individual islands comprise an etch-stop material. The etch-stop material comprises at least one of (a), (b), or (c), where: (a): the individual islands having a top material that is the etch-stop material and that is of different composition from all material that is vertically between the etch-stop material and the conductor material; (b): the top material of the individual islands being the etch-stop material and having its top surface in a vertical cross-section extending laterally-outward beyond two opposing laterally-outermost edges of a top surface of the material that is immediately directly below the top material; and (c): a different composition from that of an upper portion of the conductor material and being in the conductor tier or being directly against the conductor material of the conductor tier. An upper portion of the stack is formed directly above the lower portion. The upper portion is formed in the TAV region, above the islands, and in the array region. The upper portion comprises vertically-alternating different composition first tiers and second tiers. A TAV opening is etched in the TAV region through the first tiers and the second tiers to stop on the etch-stop material of the individual islands. An operative TAV is formed in the TAV opening that directly electrically couples with the conductor material in the conductor tier of the individual islands and strings of memory cells are formed in the array region that directly electrically couple to the conductor material in the conductor tier.

In some embodiments, a method used in forming a conductive via comprises forming islands individually comprising conductor material and multiple different composition materials there-above. Individual of the islands comprise an etch-stop material. The etch-stop material comprises at least one of (a), (b), or (c), where: (a): the individual islands having a top material that is the etch-stop material and that is of different composition from all material that is vertically between the etch-stop material and the conductor material; (b): the top material of the individual islands being the etch-stop material and having its top surface in a vertical cross-section extending laterally-outward beyond two opposing laterally-outermost edges of a top surface of the material that is immediately directly below the top material; and (c): is of different composition from that of an upper portion of the conductor material and including a portion thereof that is elevationally coincident with the conductor material or that is directly against the conductor material. Upper-portion material is formed directly above the islands. A via opening is etched through the upper-portion material to stop on the etch-stop material of the individual islands. An operative conductive via is formed in the via opening that directly electrically couples with the conductor material of the individual islands.

In some embodiments, a memory array comprising strings of memory cells comprises laterally-spaced memory blocks individually comprising a vertical stack comprising alternating insulative tiers and conductive tiers. Channel-material strings of memory cells extend through the insulative tiers and the conductive tiers. Through-array-vias (TAVs) extend through the insulative tiers and the conductive tiers to be directly against conductor material of islands. The islands comprise multiple different composition materials directly above the conductor material. Apart from the TAVs, the islands individually comprise at least one of (a), (b), or (c), where: (a) a top material that is of different composition from all material that is vertically between the top material and the conductor material; (b): the top material having its top surface in a vertical cross-section extending laterally-outward beyond two opposing laterally-outermost edges of a top surface of the material that is immediately directly below the top material; and (c): is of different composition from that of an upper portion of the conductor material and including a portion thereof that is elevationally coincident with the conductor material or that is directly against the conductor material.

In some embodiments, integrated circuitry comprises vertical conductive vias individually having a lower portion thereof that is directly against conductor material of islands. The islands comprise multiple different composition materials directly above the conductor material. Apart from the conductive vias, the islands individually comprise at least one of (a), (b), or (c), where: (a): a top material that is of different composition from all material that is vertically between the top material and the conductor material; (b): the top material having its top surface in a vertical cross-section extending laterally-outward beyond two opposing laterally-outermost edges of a top surface of the material that is immediately directly below the top material; and (c): is of different composition from that of an upper portion of the conductor material and including a portion thereof that is elevationally coincident with the conductor material or that is directly against the conductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    laterally-spaced memory blocks individually comprising a vertical stack comprising alternating insulative tiers and conductive tiers, channel-material strings of memory cells extending through the insulative tiers and the conductive tiers; and
    through-array-vias (TAVs) extending through the insulative tiers and the conductive tiers to be directly against conductor material of islands, the islands comprising multiple different composition materials directly above the conductor material; apart from the TAVs, the islands individually comprising at least one of (a), (b), or (c), where:
        (a): a top material that is of different composition from all material that is vertically between the top material and the conductor material;
        (b): the top material having its top surface in a vertical cross-section extending laterally-outward beyond two opposing laterally-outermost edges of a top surface of the material that is immediately directly below the top material; and
        (c): is of different composition from that of an upper portion of the conductor material and including a portion thereof that is elevationally coincident with the conductor material or that is directly against the conductor material.

2. The memory array of claim 1 comprising the (a).

3. The memory array of claim 1 comprising the (a) and not the (b).

4. The memory array of claim 1 comprising the (b).

5. The memory array of claim 1 comprising the (a) and the (b).

6. The memory array of claim 1 comprising the (c).

7. Integrated circuitry comprising:
    vertical conductive vias individually having a lower portion thereof that is directly against conductor material of islands, the islands comprising multiple different composition materials directly above the conductor material; apart from the conductive vias, the islands individually comprising at least one of (a), (b), or (c), where:
        (a): a top material that is of different composition from all material that is vertically between the top material and the conductor material;
        (b): the top material having its top surface in a vertical cross-section extending laterally-outward beyond two opposing laterally-outermost edges of a top surface of the material that is immediately directly below the top material; and
        (c): is of different composition from that of an upper portion of the conductor material and including a portion thereof that is elevationally coincident with the conductor material or that is directly against the conductor material.

8. The integrated circuitry of claim 7 comprising the (a).

9. The integrated circuitry of claim 7 comprising the (a) and not the (b).

10. The integrated circuitry of claim 7 comprising the (b).

11. The integrated circuitry of claim 7 comprising the (a) and the (b).

12. The integrated circuitry of claim 7 comprising the (c).

* * * * *